United States Patent
Wohl et al.

(10) Patent No.: US 10,346,557 B2
(45) Date of Patent: Jul. 9, 2019

(54) INCREASING COMPRESSION BY REDUCING PADDING PATTERNS

(71) Applicant: Synopsys, Inc., Mountain View, CA (US)

(72) Inventors: Peter Wohl, Williston, VT (US); John Waicukauski, Tualatin, OR (US)

(73) Assignee: Synopsys, Inc., Mountain View, CA (US)

( * ) Notice: Subject to any disclaimer, the term of this patent is extended or adjusted under 35 U.S.C. 154(b) by 42 days.

(21) Appl. No.: 15/450,962

(22) Filed: Mar. 6, 2017

(65) Prior Publication Data

US 2018/0156869 A1 Jun. 7, 2018

Related U.S. Application Data

(60) Provisional application No. 62/430,889, filed on Dec. 6, 2016.

(51) Int. Cl.
*G01R 31/00* (2006.01)
*G06F 17/50* (2006.01)
*G01R 31/3183* (2006.01)

(52) U.S. Cl.
CPC ..... *G06F 17/50* (2013.01); *G01R 31/318342* (2013.01)

(58) Field of Classification Search
None
See application file for complete search history.

(56) References Cited

U.S. PATENT DOCUMENTS

| 2005/0081130 A1* | 4/2005 | Rinderknecht | ............................. G01R 31/318547 714/726 |
| 2005/0268190 A1* | 12/2005 | Kapur | ............ G01R 31/318536 714/726 |
| 2010/0083199 A1* | 4/2010 | Wohl | ............. G01R 31/318547 716/136 |

(Continued)

OTHER PUBLICATIONS

Ramnath et al., "Test-Model Based Hierarchical DFT Synthesis," IEEE/ACM International Conference on Computer Aided Design Digest of Technical Papers, Nov. 2002, pp. 286-293.

(Continued)

*Primary Examiner* — Daniel F. McMahon
(74) *Attorney, Agent, or Firm* — Haynes Beffel & Wolfeld LLP; Yiding Wu

(57) ABSTRACT

A method for generating scan-based test patterns for an integrated circuit design includes, in a computer system, generating a number of current interval patterns for the integrated circuit design in a current pattern generation interval. The current interval patterns can be augmented to satisfy observe needs of a previous interval pattern generated in a previous pattern generation interval. Observe needs of the current interval patterns are stored in association with the current interval patterns. The current interval patterns are linked respectively to P streams of test patterns. The current pattern generation interval is subsequent to the previous pattern generation interval. The method includes simulating the current interval patterns to identify observable scan cells in the integrated circuit design, linking the P streams of test patterns into a single stream of test patterns, and storing the single stream of test patterns in a computer readable medium.

27 Claims, 15 Drawing Sheets

(56) References Cited

U.S. PATENT DOCUMENTS

2014/0095101 A1* 4/2014 Gizdarski ...... G01R 31/318335
   702/120
2017/0363685 A1* 12/2017 Douskey .......... G01R 31/31723

OTHER PUBLICATIONS

Wohl, et al., "Fully X-Tolerant Combinational Scan Compression," International Test Conference, Oct. 2007, pp. 1-10.
EP 09800722—Extended Search Report dated Oct. 17, 2012, 5 pages.

* cited by examiner

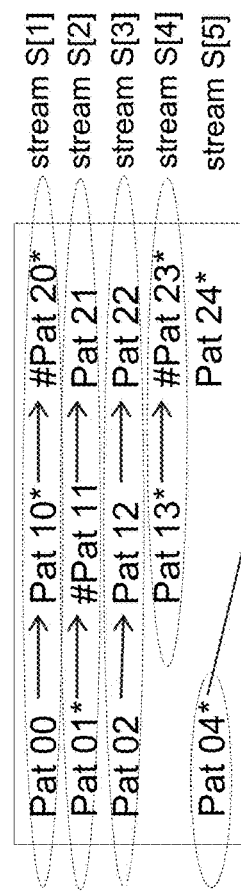
Legend
\* Pattern has unload control needs
\# Pattern is generated so that it satisfies unload control needs of a previous pattern
! Pattern cannot satisfy unload control needs of a previous pattern
FIG. 5A
|  | Interval 0 | Interval 1 |
|---|---|---|
|  | Pat 00 | Pat 10* |
|  | Pat 01* | #Pat 11 |
|  | Pat 02 | Pat 12 |
|  | Pat 03* | !Pat 13* |
|  | Pat 04* | #Pat 14* |
FIG. 5B
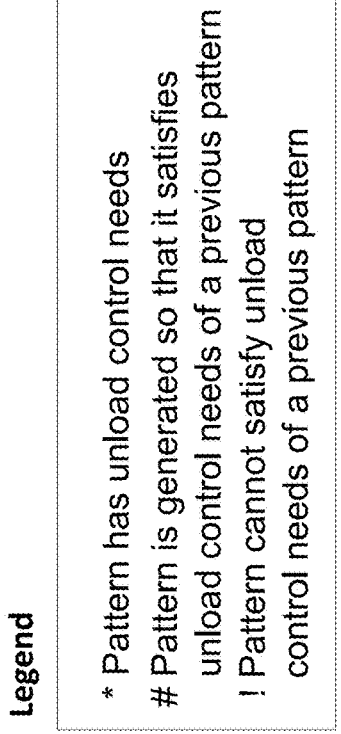
FIG. 5C
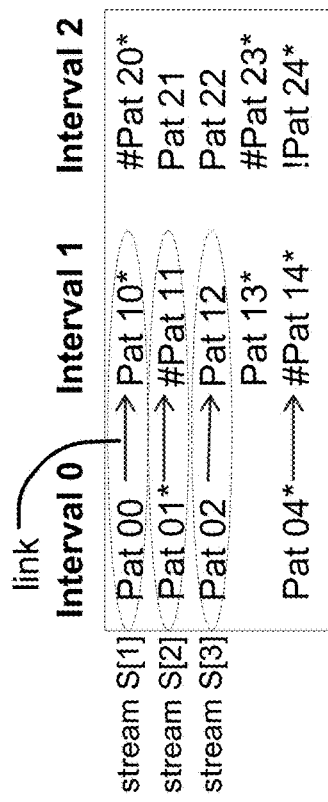
FIG. 5D

FIG. 8: Details of Step 710 in FIG. 7

FIG. 9: Details of Step 830 in FIG. 8

FIG. 10: Details of Step 830 in FIG. 8

FIG. 11: Details of Step 860 in FIG. 8

FIG. 12: Details of Step 740 in FIG. 7

FIG. 13: Details of Step 750 in FIG. 7

INCREASING COMPRESSION BY REDUCING PADDING PATTERNS

RELATED APPLICATIONS

This application claims the benefit of U.S. Provisional Patent Application No. 62/430,889 filed on 6 Dec. 2016, which application is incorporated by reference as if fully set forth herein.

FIELD

The present invention relates to automatic test pattern generation (ATPG) for integrated circuits.

BACKGROUND

Electronic design automation (EDA) is applied in the semiconductor industry for virtually all design projects. After an idea for the product is developed, EDA tools are used to define a specific implementation including lithographic masks for production of the finished chips, in a process referred to as tape-out. The lithographic masks are then used with fabrication equipment to manufacture integrated circuit wafers. Testing and diagnosis are required steps to determine defective dies and defect localization. Next, physical failure analysis is performed to identify root causes for systematic defects which are used for correction of masks, and design and fabrication process improvements in order to increase yield. Finally, the wafers are diced, packaged and assembled to provide integrated circuit chips for distribution.

An exemplary procedure for using EDA tools begins with a design specification of a product to be implemented using the integrated circuit. Next, logic design tools are applied to create a high level description based on description languages such as Verilog or VHDL, and functional verification tools are applied in an iterative process to assure that the high-level description accomplishes the design specification. Next, synthesis and design-for-test tools are used to translate the high-level description to a netlist, optimize the netlist for target technology, and insert test logic that permits testing of the finished chips.

A typical design flow might next include a design planning stage, in which an overall floor plan for the chip is constructed and analyzed to ensure that timing parameters for the netlist can be achieved at a high level. Next, the netlist may be rigorously checked for compliance with timing constraints and with the functional definitions defined at a high level using VHDL or Verilog. After an iterative process to settle on a netlist and map the netlist to a cell library for the final design, a physical implementation tool is used for placement and routing. A tool performing placement positions circuit elements on the layout, and a tool performing routing defines interconnects for the circuit elements.

The components defined after placement and routing are usually then analyzed at the transistor level using an extraction tool, and verified to ensure that the circuit function is achieved and timing constraints are met. The placement and routing process can be revisited as needed in an iterative fashion. Next, the design is subjected to physical verification procedures, such as design rule checking (DRC), layout rule checking (LRC) and layout versus schematic (LVS) checking, that analyze manufacturability, electrical performance, lithographic parameters, and circuit correctness.

After closure on an acceptable design by iteration through design and verify procedures, like those described above, the resulting design can be subjected to resolution enhancement techniques that provide geometric manipulations of the layout to improve manufacturability. Finally, the mask data is prepared and taped out for use in producing finished products.

This design process with EDA tools includes circuitry that allows the finished product to be tested. Efficient testing of integrated circuits often uses structured design for testability (DFT) techniques. In particular, these techniques are based on the general concepts of making all or some memory elements like flip-flops and latches in the circuit under test (CUT) directly controllable and observable. The most-often used DFT methodology is based on scan chains. This approach assumes that during testing all (or almost all) memory elements are included in shift registers called scan chains. As a result, the designed logic circuit has two (or more) modes of operation, including at least a functional mode and a test mode. In the functional mode, the memory elements perform their regular functions. In the test mode, the memory elements become scan cells that are connected to form one or more scan chains. These scan chains are used to scan-in test stimuli into a CUT and scan-out test responses. Applying a test pattern consists of performing scan-in of (or loading) a test stimulus, applying one or more capture clocks, and then performing scan-out of (unloading) the captured test response. The test responses are then compared to fault-free test responses to determine whether the CUT works properly.

The DFT methodology has been widely used in order to simplify testing and diagnosis. From the point of view of automatic test pattern generation (ATPG), a CUT can be treated as a combinational or partially combinational circuit. Today, ATPG software tools are able to generate a set of test patterns based on different fault models including stuck-at, transition, path delay, bridging and cell-internal faults. When a particular fault in a CUT is targeted by an ATPG tool, only a small number of scan cells (typically less than 1 percent) is set to particular values (called hereafter care bits) and one scan cell (an observable point) is observed in order to detect this fault wherein the specified care bits are required to sensitize this fault and propagate the fault effect to the selected observable point, with the remaining scan cells being don't care bits. A common approach for test application time reduction (TATR) is for the ATPG tool to target many faults with each test pattern, therefore the percentage of care bits and the number of observe points increase. Still, on average over an entire pattern set, care bits are typically only a few percent. To further reduce TATR it is common to use compressed test data rather than storing the entire test stimulus and the entire test response in the tester.

SUMMARY

An integrated circuit having a scan test architecture can have an on-chip test data compression capability, as further described in connection to FIGS. 1 and 2. The integrated circuit includes a circuit under test, a load decompressor, an unload selector, and an unload compressor. Logic added to interface outputs of the internal scan chains to the scan data outputs is referred to as a compressor, as it takes many values from the internal scan chains and funnels them to a much smaller set of scan data outputs. Test vectors may produce a response in scan out positions which are unpredictable logic values, so the scan out positions will have unknown values. The unknown values in scan chains can block observability of other values through the unload compressor, and cause loss of observability. The unload selector in the scan test architecture can provide X-tolerant modes, controlled by input unload controls.

In a scan test architecture as described herein, overlapping scan operations overlap a pattern load with a previous pattern unload, as further described in connection to FIG. 3. Conflicts can arise between values required for load (care bits) of test pattern N+1 and unload controls of test pattern N, as further described in connection to FIG. 4.

Possible solutions for load/unload conflicts include using independent controls and using dependent controls. With independent controls, separate load input data from unload controls input data are used. Consequently, extra input pins to an integrated circuit are needed, but may not be available. Even if such extra input pins are available, they will reduce compression. Also extra state elements are needed to hold input data, and will increase design complexity. With dependent controls, the ATPG must generate test patterns so that conflicts are resolved. Dependent controls work with combinational compression, and need no added state elements. The present technology is directed to generating test patterns so that conflicts are resolved, without requiring extra input pins or extra state elements.

A method is provided for generating scan-based test patterns for an integrated circuit design. Observe needs, also referred to as detection needs, are managed globally throughout the entire pattern generation, instead of adding padding patterns locally when needed for fault detection pattern by pattern. Padding patterns are reduced, often to zero. Detection needs can be satisfied by regular test patterns. During test pattern generation, multiple dynamic streams of test patterns are managed. Detection needs are precise from simulation of test patterns, and are stored in association with each test pattern.

The method includes, in a computer system, generating a number P>1 of current interval patterns for the integrated circuit design in a current pattern generation interval. Current interval patterns can be augmented to satisfy observe needs of a previous interval pattern generated in a previous pattern generation interval. Observe needs of the current interval patterns are stored in association with the current interval patterns. The current interval patterns are linked respectively to P streams of test patterns. The current pattern generation interval is subsequent to the previous pattern generation interval. The method includes simulating the current interval patterns to identify observable scan cells in the integrated circuit design, linking the P streams of test patterns into a single stream of test patterns, and storing the single stream of test patterns in a computer readable medium. The single stream of test patterns can then be delivered to chip testing equipment, and an integrated circuit having the integrated circuit design can be tested using the single stream of test patterns on the chip testing equipment.

The method includes, in the computer system, maintaining a previous interval patterns array PA of P elements for saving test patterns generated in the previous pattern generation interval, a current interval patterns array CA of P elements for saving test patterns generated in the current pattern generation interval, and a needy patterns list for linking to test patterns having unsatisfied observe needs. In the computer system, before the generation of a number of current interval patterns for the integrated circuit design in a current pattern generation interval, the previous interval patterns array is initialized to have zero elements; the current interval patterns array CA is initialized to have zero elements; and the needy patterns list is initialized to be an empty list.

To generate a number P>1 of current interval patterns in the current pattern generation interval, the method can include the following steps, for n going from 1 to P:

generating a current interval pattern for the integrated circuit design, including determining the observe needs of the current interval pattern;

augmenting the current interval pattern to satisfy observe needs of a previous interval pattern saved in an element PA[n] in the previous interval patterns array PA or linked in the needy patterns list;

storing the observe needs determined by said generating the current interval pattern in association with the current interval pattern;

saving the current interval pattern in an element CA[n] in the current interval patterns array CA; and linking the element CA[n] to a stream S[n] in the P streams.

The observe needs determined by the generating step can identify scan cells required to be observed in the integrated circuit design.

The augmenting step can include: if the element PA[n] exists and has unsatisfied observe needs, then augmenting the current interval pattern to satisfy the observe needs of the element PA[n]; and if the observe needs of the element PA[n] is not satisfied, then linking the element PA[n] in the needy patterns list.

The augmenting step can further include: if the element PA[n] does not exist, or the element PA[n] exists but has unsatisfied observe needs, then if the needy patterns list is not empty, then iterating the needy patterns list. The iterating step can include augmenting the current interval pattern to satisfy the observe needs of a needy pattern linked in the needy patterns list; and if the observe needs of the needy pattern is satisfied, then saving the needy pattern in the element PA[n] in the previous interval patterns array PA; removing the needy pattern from the needy patterns list; and exiting said iterating. If the observe needs of the needy pattern is not satisfied, then the iterating step is continued until the needy patterns list does not have any patterns having observe needs to be satisfied.

The linking the element CA[n] step can include: if the element PA[n] exists in the previous interval patterns array PA, then linking the element CA[n] in the current interval patterns array CA after the element PA[n], where the element PA[n] is linked in the stream S[n]; else starting the stream S[n] with the element CA[n].

In the computer system, after the simulating step and before the linking the P streams step, the method can include copying the current interval patterns saved in elements in the current interval patterns array to corresponding elements in the previous interval patterns array.

In the computer system, after the copying step and before the linking the P streams step, the method can include: if a number of additional test patterns needed after the current pattern generation interval is equal to or greater than P, then in a next pattern generation interval subsequent to the current pattern generation interval, repeating the step for generating the number P>1 of current interval patterns. If a number of additional test patterns needed after the current pattern generation interval is less than P, and the needy patterns list is not empty, then the method can include: creating a padding pattern to satisfy observe needs of a needy pattern in the needy patterns list; and inserting the padding pattern after the needy pattern in the needy patterns list.

The step for linking the P streams can include, in the computer system, repeating for s going from 2 to P, linking the first test pattern in a stream S[s] in the P streams after the last test pattern in a stream S[s−1] in the P streams.

Particular aspects of the present technology are described in the claims, specification and drawings.

BRIEF DESCRIPTION OF THE FIGURES

The present technology is illustrated by way of example, and not by way of limitation, in the figures of the accompanying drawings and in which like reference numerals refer to similar elements and in which:

FIGS. 5A, 5B, 5C, 5D, 5E and 5F illustrate example automatic test pattern generation (ATPG) in accordance with the present technology.

DETAILED DESCRIPTION

The following detailed description is made with reference to the figures. Preferred embodiments are described to illustrate the present technology, not to limit its scope, which is defined by the claims. Those of ordinary skill in the art will recognize a variety of equivalent variations on the description that follows.

Figure 1:
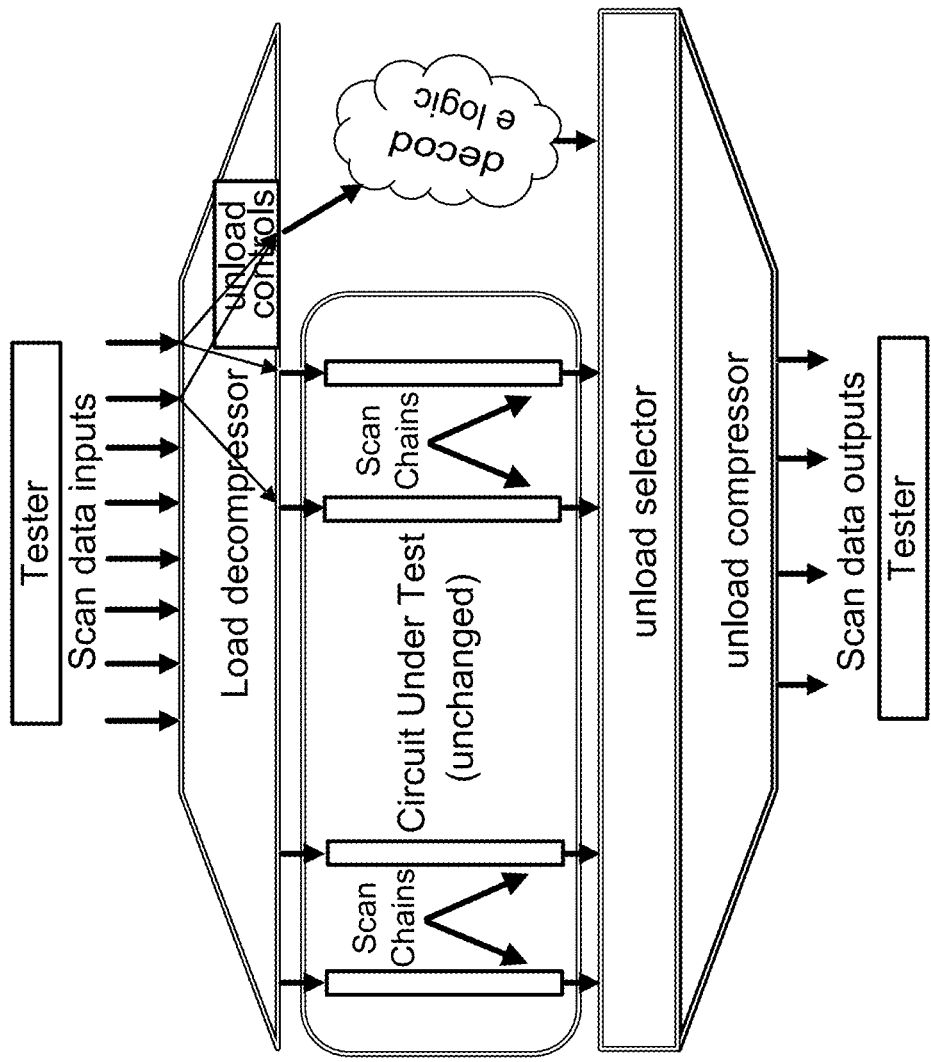
FIG. 1 illustrates an example block diagram of an integrated circuit having a scan test architecture having an on-chip test data compression capability.

FIG. 1 illustrates an example block diagram of an integrated circuit having a scan test architecture having an on-chip test data compression capability. The integrated circuit includes a circuit under test (CUT), a load decompressor, an unload selector, and an unload compressor. A tester is coupled to an integrated circuit. In addition, the CUT may have one or more cores such that each core has an individual decompressor and compressor. Characteristics of decompressor and compressor schemes have a major impact on the level of test data compression.

A decompressor is inserted between the scan data inputs and the scan chains, which is operable in a number of different modes for delivering values of scan data inputs (or values derived therefrom) to the scan chains. For instance, the different modes can include a direct observation mode in which the unload selector functions as a filter so that the unload compressor does not XOR together any of the unload values, to ensure full X-tolerance. For each shift of the scan chain within a test pattern, the tester sets the decompressor into the proper mode required for that particular position of the test vector. Logic added to interface scan data inputs with the internal scan chains is referred to as a decompressor; this is because it takes only a few input values to supply a much larger set of receiving internal scan chains.

Logic added to interface outputs of the internal scan chains to the scan data outputs is referred to as a compressor, as it takes many values from the internal scan chains and funnels them to a much smaller set of scan data outputs. A compressor can include only combinational gates, such as XOR gates. Sometimes test vectors produce a response in scan out positions which are unpredictable logic values. These unpredictable logic values could come from un-initialized memory elements, or from bus-contention or unpredictable timing related issues. These scan out positions will have an unknown value. These unknowns are sometimes notated as Logic-X's (unknowns). They can have a negative impact on the observability of good (i.e., fault-free) responses that are coming together in the compressor. An unload selector is inserted between the outputs of the internal scan chains and the inputs of the unload compressor, and is further described in connection with FIG. 2.

Figure 2:
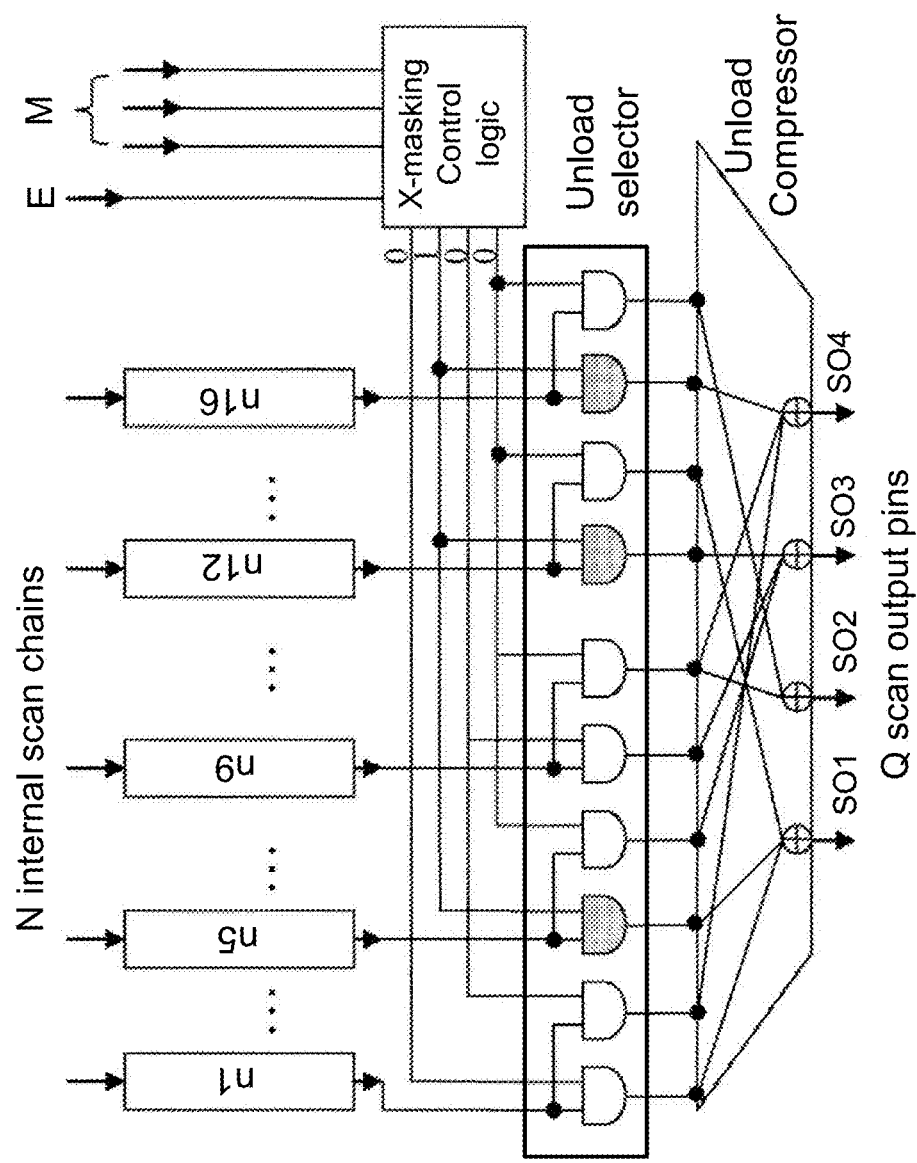
FIG. 2 illustrates an example of masking logic for a compressor.

FIG. 2 illustrates an example of masking logic for a compressor that has redundancy in the XORs of the compressor. In this example, the masking logic ensures that within any group of scan chains that are observed the logic-X's in the response captured in any of the scan cells does not interfere in the observability of the scan cells in other scan chains.

The unload selector can include only combinational gates, such as AND gates, maintaining a simple scan flow. For most shift cycles, the unload selector functions transparently; it simply passes through unload values of all N internal scan chains with no change. This is sufficient for shift cycles where the unknown values, if any, do not mask any desired observability. However, when needed, a group of exactly Q scan chains are selected for direct observation (one-to-one) at the Q scan outputs. In direct observation mode, the unload selector functions as a filter so that the unload compressor does not XOR together any of the unload values.

Figure 3:
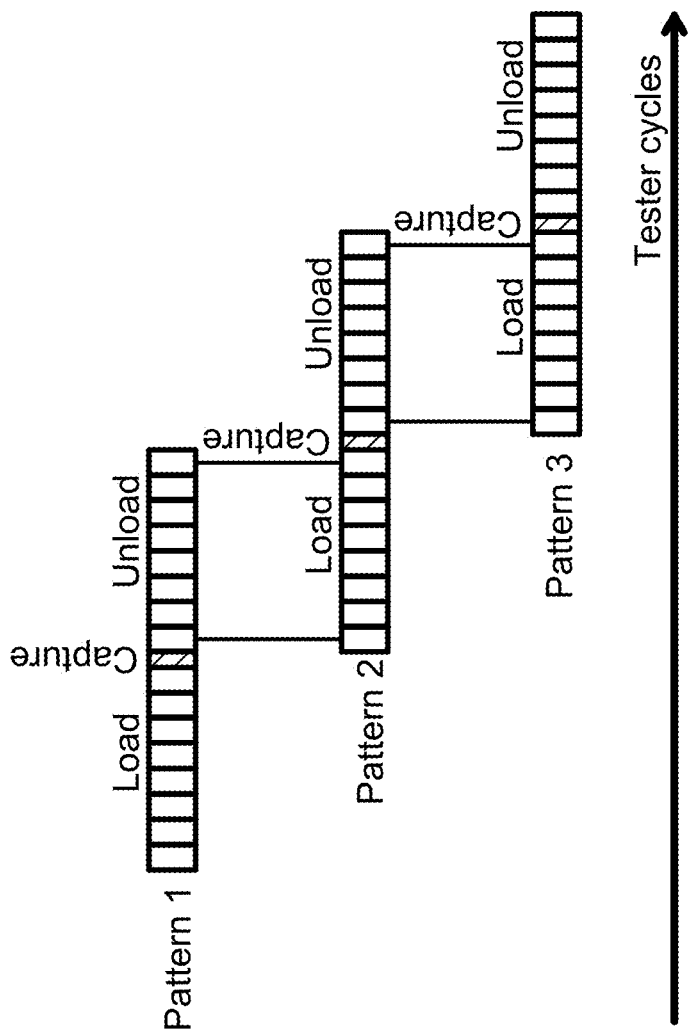
FIG. 3 illustrates overlapping scan operations of adjacent test patterns.

FIG. 3 illustrates overlapping scan operations of adjacent test patterns. Overlapping scan operations overlap a pattern load with the previous pattern unload. In FIG. 3, a pattern load of Pattern 2 overlaps with the previous pattern unload of Pattern 1, and a pattern load of Pattern 3 overlaps with the previous pattern unload of Pattern 2. Conflicts can arise between values required for load (care bits) of test pattern N+1 and unload controls of test pattern N.

Figure 4:
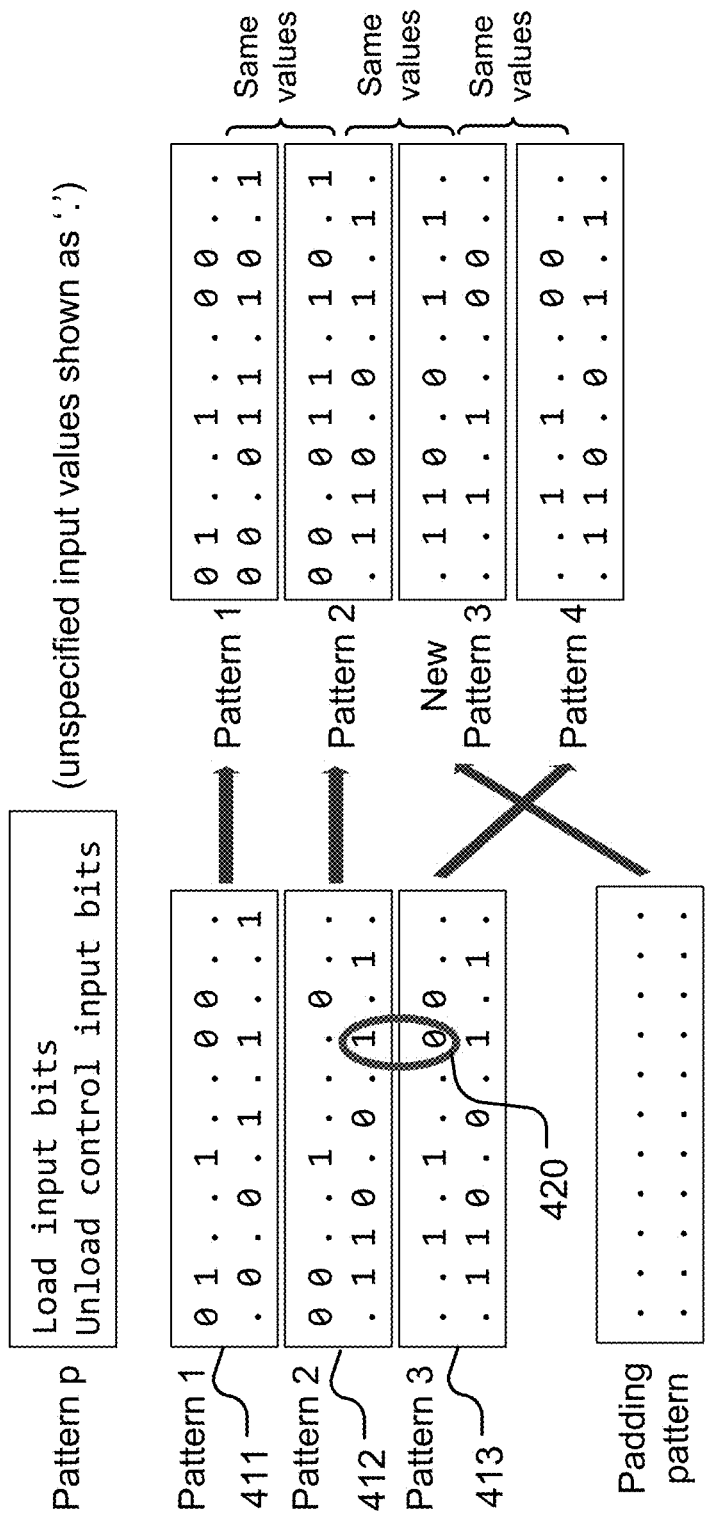
FIG. 4 illustrates use of padding patterns to solve conflicts.

FIG. 4 illustrates use of padding patterns in prior art to solve conflicts in ATPG. Before a padding pattern is added, there are three test patterns Pattern 1, Pattern 2 and Pattern 3, illustrated with Blocks 411, 412 and 413 respectively. Each of the blocks includes load input bits at an upper row and unload control input bits at a lower row. For instance, Pattern 1 is illustrated with Block 411 including load input bits "0 1 . . 1 . . 0 0 . ." at an upper row and unload control input bits ". 0 . 0 . 1 . 1 . . 1" at a lower row, where "0" and "1" indicate logic values and "." indicate an unspecified input value commonly referred to as "don't care".

During overlapping scan operations, load input bits of Pattern 2 overlaps with respective unload control input bits of Pattern 1, where there are no conflicts because two respective bits in the load input bits and in the unload control input bits either both have the same specified value (e.g. both "0"), both are unspecified (e.g. both "."), or one of them is unspecified. During overlapping scan operations, load input bits of Pattern 3 overlaps with unload control input bits of Pattern 2, where a conflict occurs because two respective bits in the load input bits and in the unload control input bits have different specified values "1" and "0", as indicated by the circle 420.

To solve this conflict, a padding pattern (e.g. New Pattern 3) is added between Pattern 2 and Pattern 3, and Pattern 3 becomes Pattern 4. Load input bits of New Pattern 3 have the same values as the unload control input bits of Pattern 2, and unload control input bits of New Pattern 3 have the same values as the load input bits of Pattern 3 before the padding pattern is added, which are the same as the load input bits of Pattern 4 after the padding pattern is added. Although the conflict can be solved using added padding patterns, the added padding patterns reduce compression of test patterns, increase pattern count, and increase test application time and the amount test data to store and process.

In automatic test pattern generation (ATPG), first, a test generator creates test patterns for an ATPG interval, e.g. a group of 32 test patterns. Second, the test patterns in an interval are simulated, in parallel, and Xs (unknowns) are identified. Third, fault simulation is performed on the test patterns, considering the actual observability which may have been reduced by Xs. The three steps can then be repeated for a next ATPG interval.

In the present technology for automatic test pattern generation (ATPG), multiple streams of test patterns are generated in simulation intervals, and unload control needs are saved in each test pattern. As used herein, unload control needs can also be referred to as observe needs or detection needs. Saving unload control needs refers to saving unload control input bits that are provided to an unload selector that works in conjunction with an unload compressor to ensure no loss of observability irrespective of the number and distribution of Xs, rather than saving positions of Xs. The test patterns are simulated assuming unload control needs have been satisfied. When generating test patterns, unload control needs of a previous test pattern can be satisfied. Test patterns are linked so that unload control needs can be satisfied. Padding patterns are added only at the end of ATPG if there are any remaining test patterns with unload control needs.

FIGS. 5A, 5B, 5C, 5D, 5E and 5F illustrate example automatic test pattern generation (ATPG) in accordance with the present technology.

Figure 5E:
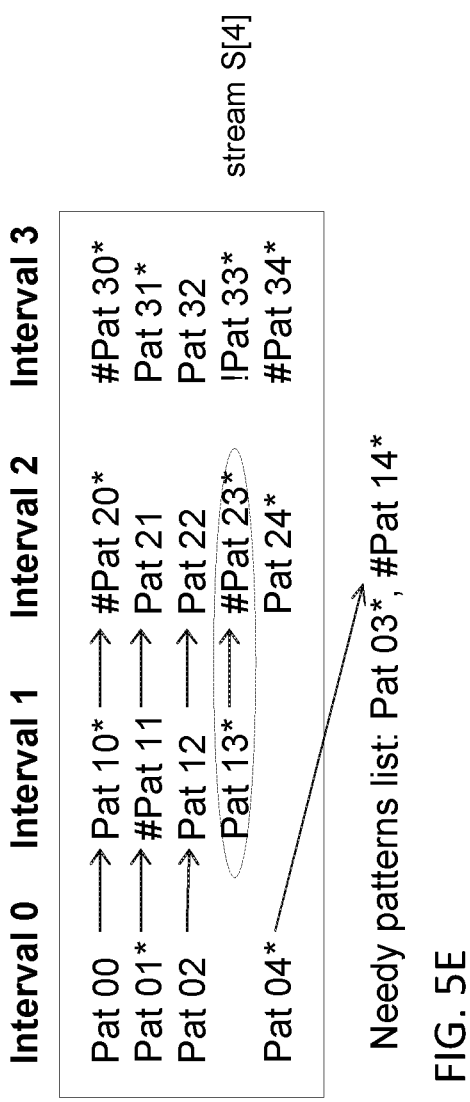

FIG. 5A illustrates legend used for test patterns in FIGS. 5B, 5C, 5D, 5E and 5F. A "*" indicates that a test pattern is generated so that it has unload control needs, such as a test pattern including unload control bits. A "#" indicates that a test pattern is generated so that it satisfies unload control needs of a previous pattern. In particular, the generation of a test pattern indicated with a "#" includes augmenting the test pattern by adding non-conflicting input values to the test pattern to satisfy observe needs of a previous interval pattern generated in a previous pattern generation interval or linked in a needy patterns list. A "!" indicates that a test pattern is generated so that it cannot satisfy unload control needs of a previous test pattern.

FIG. 5B illustrates example test patterns generated in a previous pattern generation interval (e.g. Interval 0) and a current pattern generation interval (e.g. Interval 1) subsequent to Interval 0. Although only two pattern generation intervals are shown in FIG. 5B, a test generation can have more than two pattern generation intervals, such as Interval 2 subsequent to Interval 1 and Interval 3 subsequent to Interval 2. Five test patterns, e.g., Pat 00, Pat 01*, Pat 02, Pat 03*, and Pat 04*, are generated for Interval 0. Another five test patterns, e.g., Pat 10*, Pat 11, Pat 12, !Pat 13*, and #Pat 14*, are generated for Interval 1. Although five test patterns are shown for each pattern generation interval, a different number of test patterns can be generated for a pattern generation interval, such as 32 test patterns. In Interval 0, test patterns Pat 00 and Pat 02 do not have unload control needs (a.k.a. observe needs), while test patterns Pat 01*, Pat 03* and Pat 03* have unload control needs. In Interval 1, test pattern Pat 10* has unload control needs, #Pat 11 satisfies unload control needs of a previous test pattern, test pattern Pat 12 does not have unload control needs, !Pat 13* has unload control needs and cannot satisfy unload control needs of a previous test pattern, and #Pat 14* has unload control needs and satisfies unload control needs of a previous test pattern.

FIG. 5C illustrates multiple streams of test patterns, and linking test patterns in Interval 1 after test patterns in Interval 0 in respective streams to satisfy unload control needs of the test patterns in Interval 0, where Interval 1 is subsequent to Interval 0. FIG. 5C also illustrates five test patterns, e.g., #Pat 20*, Pat 21, Pat 22, #Pat 23* and !Pat 24*, generated by the test generator in a next interval (e.g., Interval 2) subsequent to Interval 1. As shown in FIG. 5C, test pattern 10* in Interval 1 is linked after test pattern Pat 00 in Interval 0 in a stream (e.g. stream S[1]), and test pattern 12 in Interval 1 is linked after test pattern Pat 02 in Interval 0 in another stream (e.g. stream S[3]).

As shown in FIG. 5C, test pattern #Pat11 generated in Interval 1 is linked after test pattern Pat 01* generated in Interval 0. Since test pattern #Pat11 satisfies unload control needs of a previous test pattern, e.g. Pat 01*, linking test pattern #Pat11 after test pattern Pat 01* satisfies the unload control needs of test pattern Pat 01*. Similarly, test pattern #Pat14* generated in Interval 1 is linked after test pattern Pat 04* generated in Interval 0. Since test pattern #Pat14* satisfies unload control needs of a previous test pattern, e.g. Pat 04*, linking test pattern #Pat14* after test pattern Pat 04* satisfies the unload control needs of test pattern Pat 04*.

Test pattern Pat 03* generated in Interval 0 has unload control needs, but test pattern !Pat 13* in Interval 1 cannot satisfy unload control needs of a previous test pattern. Therefore test pattern !Pat 13* cannot be linked after test pattern Pat 03*, and test pattern Pat 03* is added to a needy patterns list. As used herein, a needy patterns list includes test patterns that have unload control needs (a.k.a. observe needs), but could not yet be satisfied by subsequent test patterns in respective streams of test patterns. A needy pattern added to the needy patterns list during a pattern generation interval may be removed from the needy patterns list when its unload control needs are satisfied by a test pattern generated for a later pattern generation interval.

FIG. 5D illustrates linking test patterns generated in Interval 2 after test patterns generated in Interval 1 in respective streams to satisfy unload control needs in test patterns generated in Interval 1, where Interval 2 is subsequent to Interval 1. In a stream of test patterns (e.g. stream S[1]) starting with test pattern Pat 00 in Interval 0, test pattern #Pat 20* in Interval 2 is linked after test pattern Pat 10* in Interval 1, and the unload control needs of test pattern Pat 10* are satisfied by test pattern #Pat 20*.

In streams of test patterns (e.g. stream S[2], stream S[3]) starting with test patterns Pat 01* and Pat 02 in Interval 0, test patterns #Pat 11 and Pat 12 in Interval 1 have no unload control needs, and test patterns Pat 21 and Pat 22 in Interval 2 are linked after test patterns #Pat 11 and Pat 12 in Interval 1 respectively. In a stream of test patterns (e.g. stream S[4]) starting with a test pattern Pat 13* in Interval 1, test pattern #Pat 23* in Interval 2 is linked after test pattern Pat 13* in Interval 1, and the unload control needs of test pattern Pat 13* are satisfied by test pattern #Pat 23*.

For a stream of test patterns (e.g. stream S[5]) starting with test pattern Pat 04* in Interval 0, test pattern #Pat 14* in Interval 1 has unload control needs, but test pattern !Pat24* in Interval 2 cannot satisfy unload control needs of the previous test pattern #Pat 14*. Therefore test pattern !Pat 24* in Interval 2 cannot be linked after test pattern Pat #14* in Interval 1, and test pattern Pat #14* in Interval 1 is added to the needy patterns list. The needy patterns list now includes test patterns Pat 03* and #Pat 14*.

FIG. 5E illustrates five test patterns, e.g. #Pat 30*, Pat 31*, Pat 32, !Pat 33* and #Pat 34*, generated by the test generator in a next pattern generation interval (e.g., Interval 3) subsequent to Interval 2. The needy patterns list still includes test patterns Pat 03* and #Pat 14*.

Figure 5F:
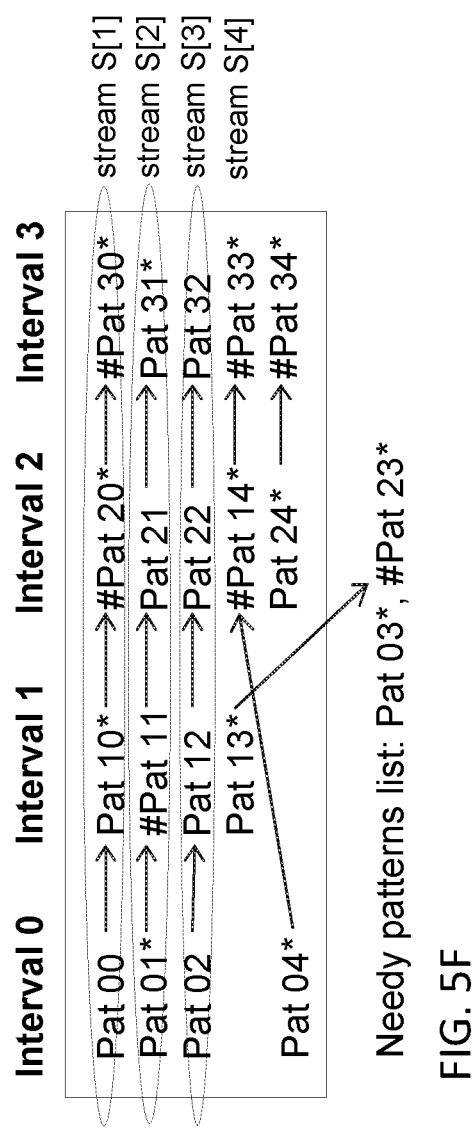

FIG. 5F illustrates linking test patterns in Interval 3 after test patterns in Interval 2 in respective streams to satisfy unload control needs of the test patterns in Interval 2. In a stream of test patterns (e.g. stream S[1]) starting with test pattern Pat 00 in Interval 0, test pattern #Pat 30* in Interval 3 is linked after test pattern #Pat 20* in Interval 2, and the unload control needs of test pattern #Pat 20* are satisfied by test pattern #Pat 30*. In streams of test patterns starting with test patterns Pat 01* and Pat 02 (e.g. streams S[1] and S[2]), Test patterns Pat 21 and Pat 22 in Interval 2 have no unload control needs, and test patterns Pat 31* and Pat 32 in Interval 3 are linked to test patterns Pat 21 and Pat 22 in Interval 2 respectively.

For a stream of test patterns starting with test pattern Pat 13* in Interval 1 (e.g. stream S[4], FIG. 5E), test pattern #Pat 23* in Interval 2 has unload control needs, but test pattern !Pat33* in Interval 3 cannot satisfy unload control needs of the previous test pattern #Pat 23*. Therefore test pattern !Pat 33* in Interval 3 cannot be linked after test pattern Pat #23*, and test pattern Pat #23* is added to the needy patterns list (FIG. 5F).

In Interval 3, test pattern !Pat 33* cannot satisfy unload control needs of test pattern #Pat 23*, but can satisfy unload control needs of #Pat 14* which is on the needy patterns list. Therefore #Pat 14* is removed from the needy patterns list and test pattern #Pat 33* is linked after #Pat 14*. The needy patterns list now includes test patterns Pat 03* and #Pat 23*.

The process of pattern generation as illustrated by examples in FIGS. 5A, 5B, 5C, 5D, 5E and 5F continues until all unload control needs in the test patterns are satisfied, and the needy patterns list is empty or does not have any test patterns that have unload control needs that need to be satisfied.

Figure 6:
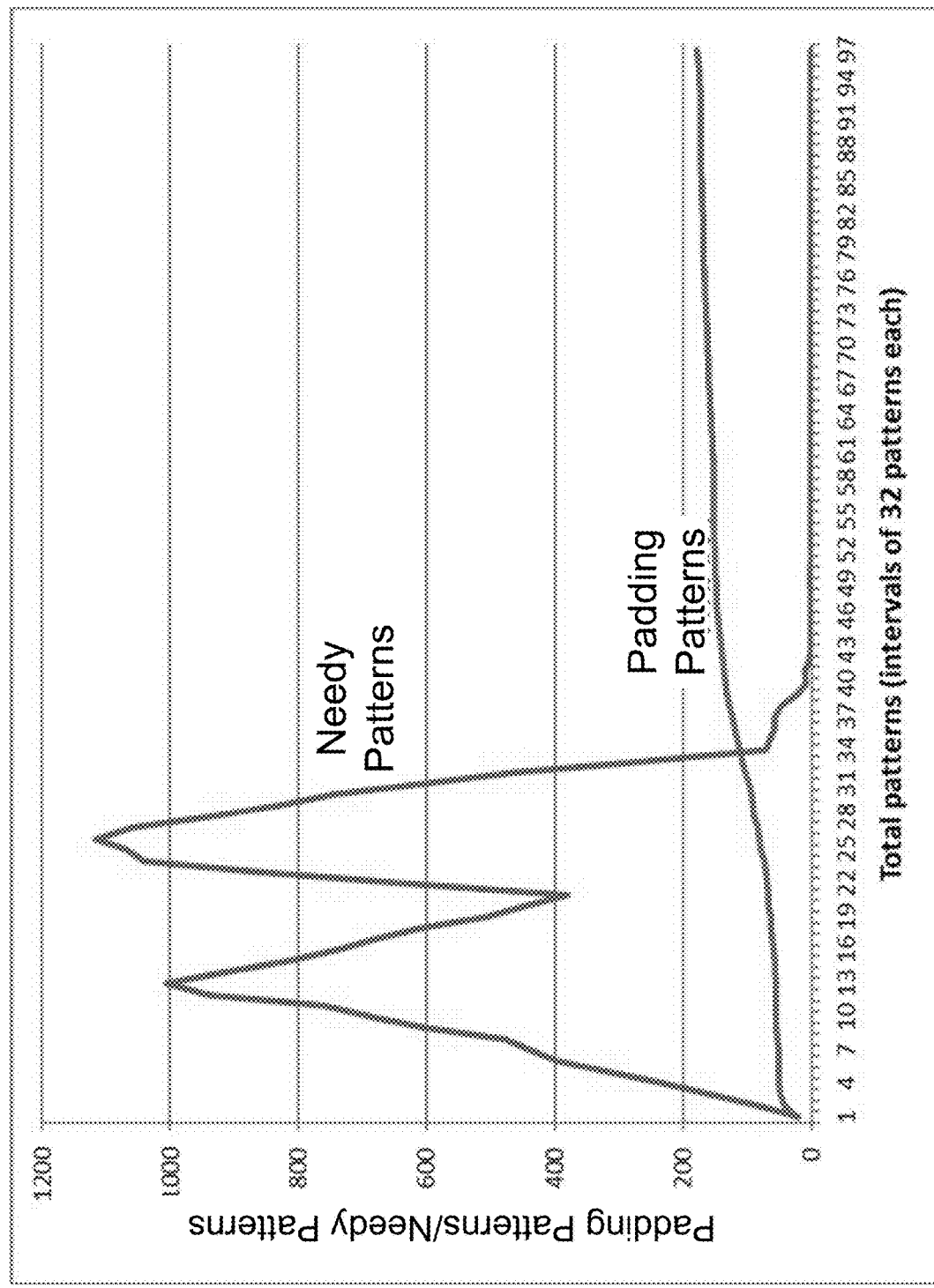
FIG. 6 illustrates a number of needy patterns in the present technology vs a number of padding patterns in a previous technology over intervals of patterns in ATPG.

FIG. 6 illustrates a number of needy patterns in the present technology vs a number of padding patterns in a previous technology over intervals of patterns in ATPG. In a previous technology, the number of padding patterns keeps growing over intervals of patterns in ATPG, resulting in more test patterns, longer test application time, and more test data to store and process. The needy patterns list grows at the beginning of ATPG when test patterns target many faults and have many load care bits, and shrinks at the end of ATPG when test patterns target few faults and have few load care bits. Each test pattern moved out of the needy patterns list saves a padding pattern.

FIGS. 7-13 illustrate an example flow for generating scan-based test patterns for an integrated circuit design in accordance with the present technology. Each step of the flow can be implemented by causing a computer system such as 1410 (FIG. 14) to operate in the specified manner.

Figure 7:
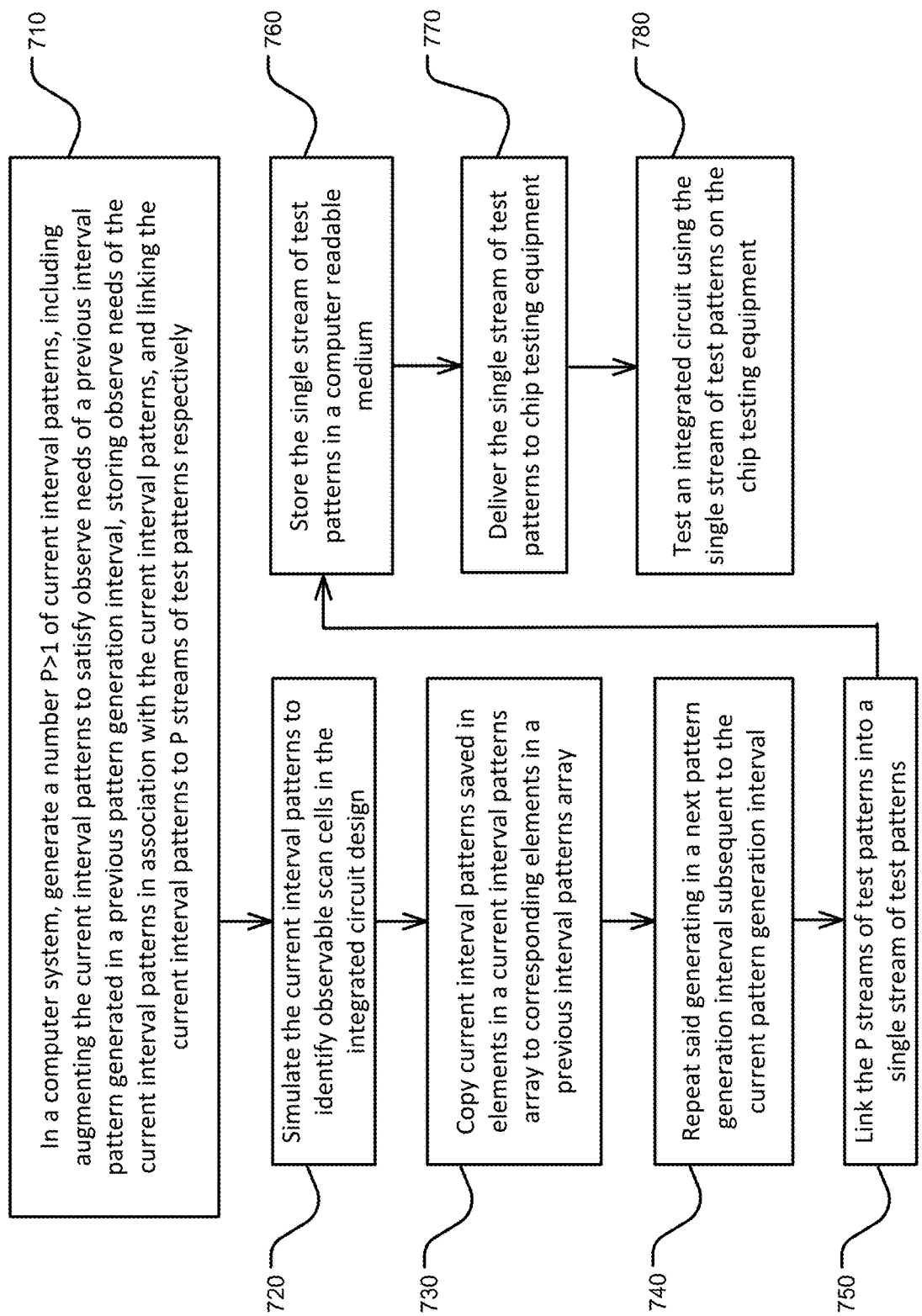
FIGS. 7-13 illustrate an example flow for generating scan-based test patterns for an integrated circuit design in accordance with the present technology.

As shown in FIG. 7, in a computer system (e.g. 1410, FIG. 14), at Step 710, a number P>1 of current interval patterns (e.g., P=5, 5 current interval patterns Pat 10*, Pat 11, Pat 12, !Pat 13*, and #Pat 14* in FIG. 5B) is generated for an integrated circuit design in a current pattern generation interval (e.g. Interval 1, FIG. 5B). Current interval patterns (e.g. #Pat 11, FIG. 5B) can be augmented to satisfy observe needs of a previous interval pattern (e.g. Pat 01*, FIG. 5B) generated in a previous pattern generation interval (e.g. Interval 0, FIG. 5B), where the current pattern generation interval is subsequent to the previous pattern generation interval. Observe needs of the current interval patterns are stored in association with the current interval patterns. The current interval patterns are linked to P streams of test patterns respectively (e.g. FIGS. 5C, 5D, 5E and 5F). Generation of a number P>1 of current interval patterns in a current pattern generation interval is further described in connection to FIG. 8.

At Step 720, the current interval patterns are simulated to determine values, including unknown values (Xs), for all scan cells in the integrated circuit design, and thereby identifying observable scan cells (i.e., scan cells which can be observed) and scan cells which are masked out for the integrated circuit design.

At Step 730, the current interval patterns saved in elements in a current interval patterns array are copied to corresponding elements in a previous interval patterns array. Consequently, the current interval patterns generated in a current iteration of the flow are used as previous interval patterns in a next iteration of the flow.

At Step 740, if a number of additional test patterns needed after the current pattern generation interval is equal to or greater than P, then Step 710 can be repeated in a next pattern generation interval subsequent to the current pattern generation interval. Generation of additional test patterns is further described in connection to FIG. 12.

At Step 750, the P streams of test patterns can be linked into a single stream of test patterns. Linking of the P streams is further described in connection to FIG. 13. At Step 760, the single stream of test patterns can be stored in a computer readable medium for example in storage subsystem 1424 of computer system 1410. At Step 770, the single stream of test patterns can be delivered to chip testing equipment, and at Step 780, an integrated circuit having the integrated circuit design can be tested using the single stream of test patterns on the chip testing equipment.

Figure 8:
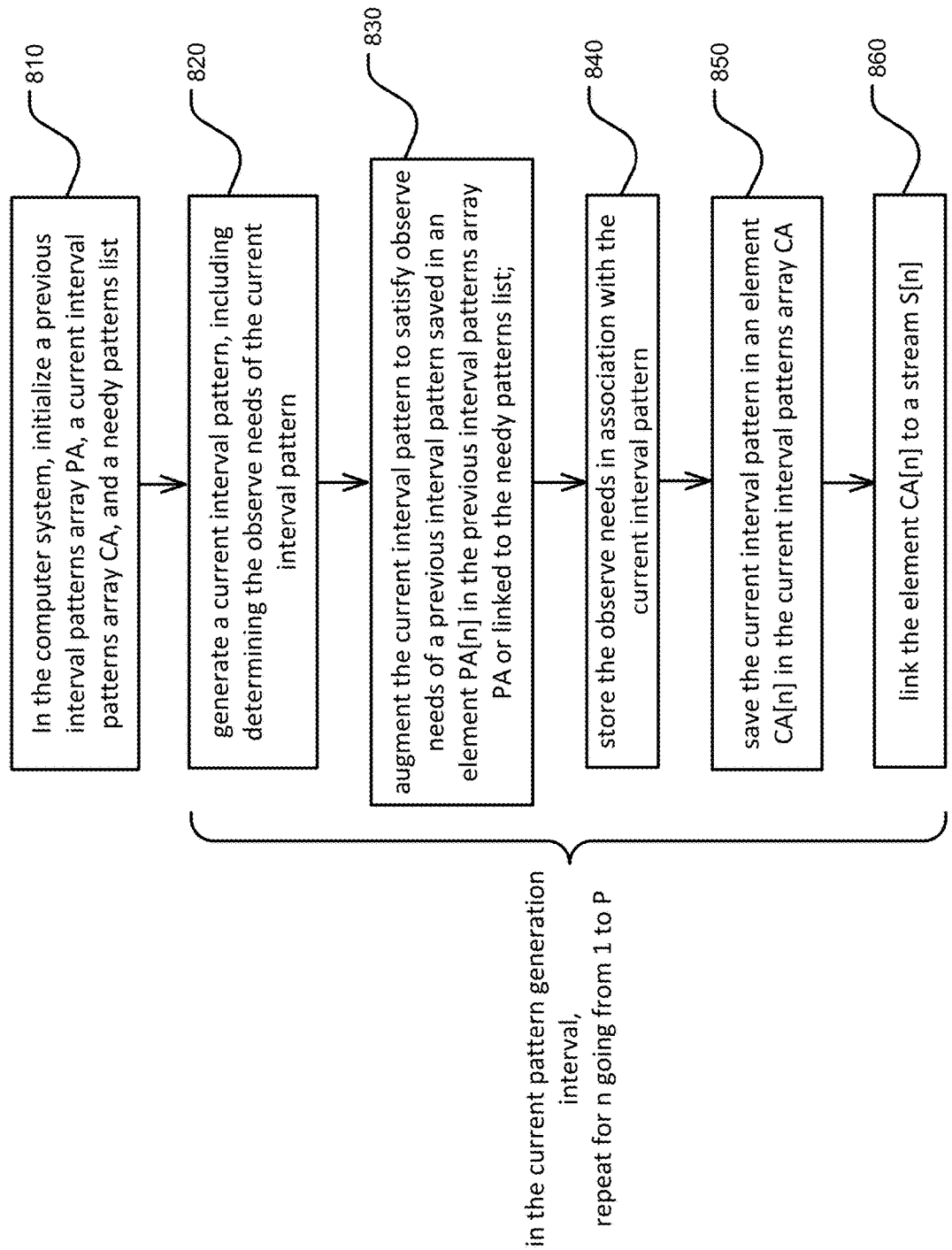

FIG. 8 illustrates Step 710 in the example flow, for generating a number P>1 of current interval patterns for the integrated circuit design in a current pattern generation interval. The flow maintains a previous interval patterns array PA of P elements for saving test patterns generated in the previous pattern generation interval, a current interval patterns array CA of P elements for saving test patterns generated in the current pattern generation interval, and a needy patterns list for linking to test patterns having unsatisfied observe needs.

At Step 810, the previous interval patterns array is initialized to have zero element; the current interval patterns array is initialized to have zero element; and the needy patterns list is initialized to be an empty list. Steps 820, 830, 840, 850 and 860 are repeated for n going from 1 to P, where n is an index number used with the previous interval patterns array PA, the current interval patterns array CA, and the streams S, and P indicates a size of the previous interval patterns array PA, of the current interval patterns array CA, and of the streams S.

At Step 820, in the current pattern generation interval, a current interval pattern is generated for the integrated circuit design, including determining the observe needs of the current interval pattern, where the observe needs identify scan cells required to be observed in the integrated circuit design.

At Step 830, the current interval pattern is augmented to satisfy observe needs of a previous interval pattern saved in an element PA[n] in the previous interval patterns array PA or linked in the needy patterns list. Augmenting the current interval pattern is further described in connection to FIGS. 9 and 10.

At Step 840, the observe needs determined for the current interval pattern at Step 820 is stored in association with the current interval pattern.

At Step 850, the current interval pattern generated at Step 820 is saved in an element CA[n] in the current interval patterns array CA.

At Step 860, the element CA[n] is linked to a stream S[n] in the P streams. Linking the element CA[n] is further described in connection to FIG. 11.

Figure 9:
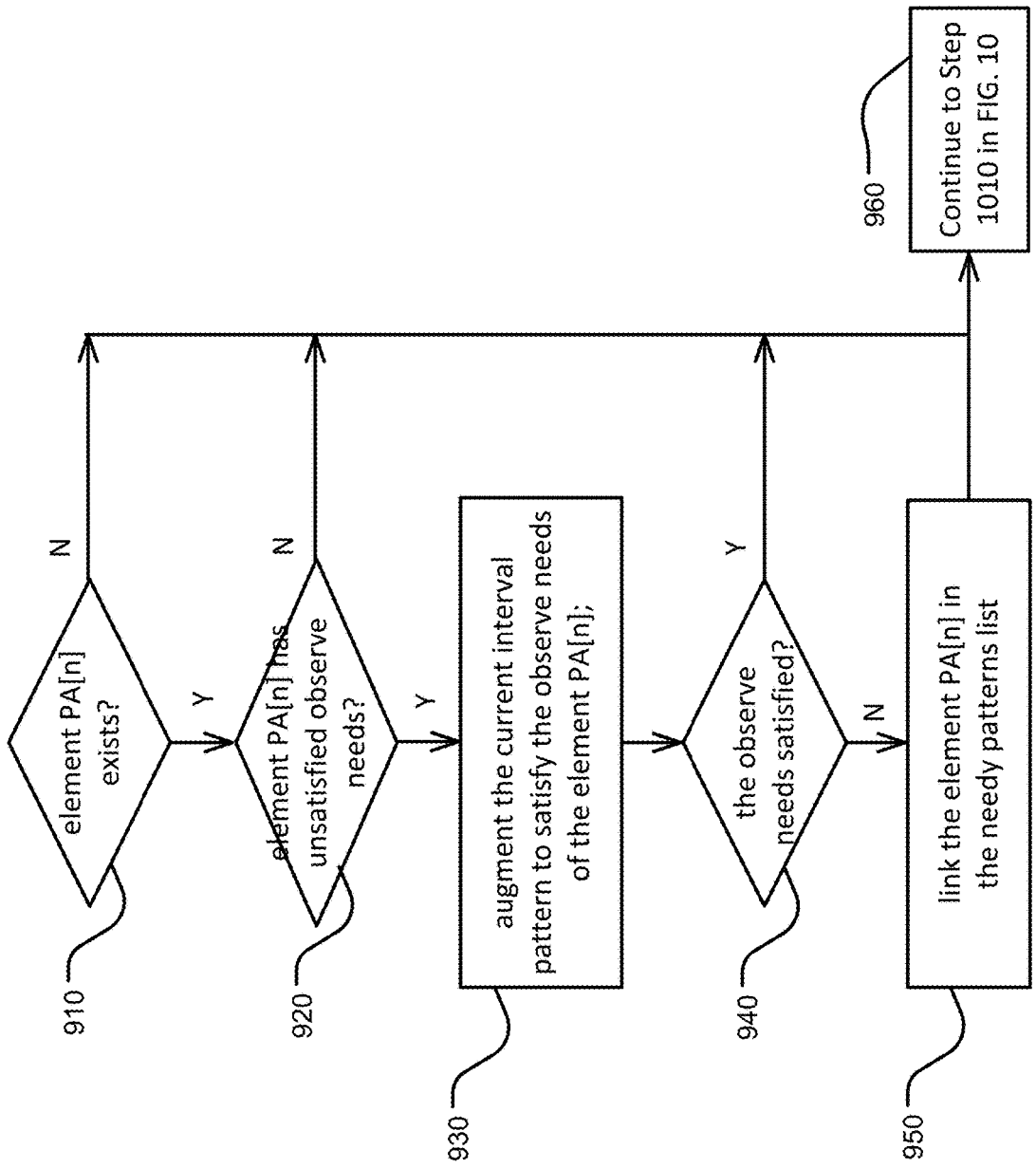

FIG. 9 illustrates an example for augmenting the current interval pattern (830, FIG. 8). As shown in FIG. 9, it is determined if the element PA[n] exists in the previous interval patterns array PA (Step 910). If the element PA[n] exists (Step 910->Y), then it is determined if the element PA[n] has unsatisfied observe needs (Step 920). If the element PA[n] has unsatisfied observe needs (Step 920->Y), then the current interval pattern is augmented to satisfy the observe needs of the element PA[n] (Step 930). In particular, the current interval pattern can be augmented by adding non-conflicting input values to the current interval pattern to satisfy the observe needs of the element PA[n] which is generated in a previous pattern generation interval. As shown in the example of FIG. 5C, the element PA[n] can correspond to test patterns Pat 00, Pat01* and Pat 02 in Interval 0, and the test patterns Pat 10*, #Pat 11 and Pat 12 in Interval 1 can correspond to the current interval pattern, respectively.

If the observe needs of the element PA[n] is not satisfied, i.e., the augmenting fails (Step 940->N), then the element PA[n] is linked in the needy patterns list (Step 950). As shown in the example of FIG. 5C, test pattern Pat 03* in a previous pattern generation interval (e.g. Interval 0) has unload control needs (a.k.a. observe needs), but test pattern !Pat 13* in a current pattern generation interval (e.g. Interval 1) cannot satisfy unload control needs of a previous test pattern. Therefore test pattern Pat 03* is linked to the needy patterns list. As shown in the example of FIG. 5D, test pattern #Pat 14* in a previous pattern generation interval (e.g. Interval 1) has unload control needs, but test pattern !Pat 24* in a current pattern generation interval (e.g. Interval 2) cannot satisfy unload control needs of a previous test pattern. Therefore test pattern #Pat 14* is linked to the needy patterns list.

Figure 10:
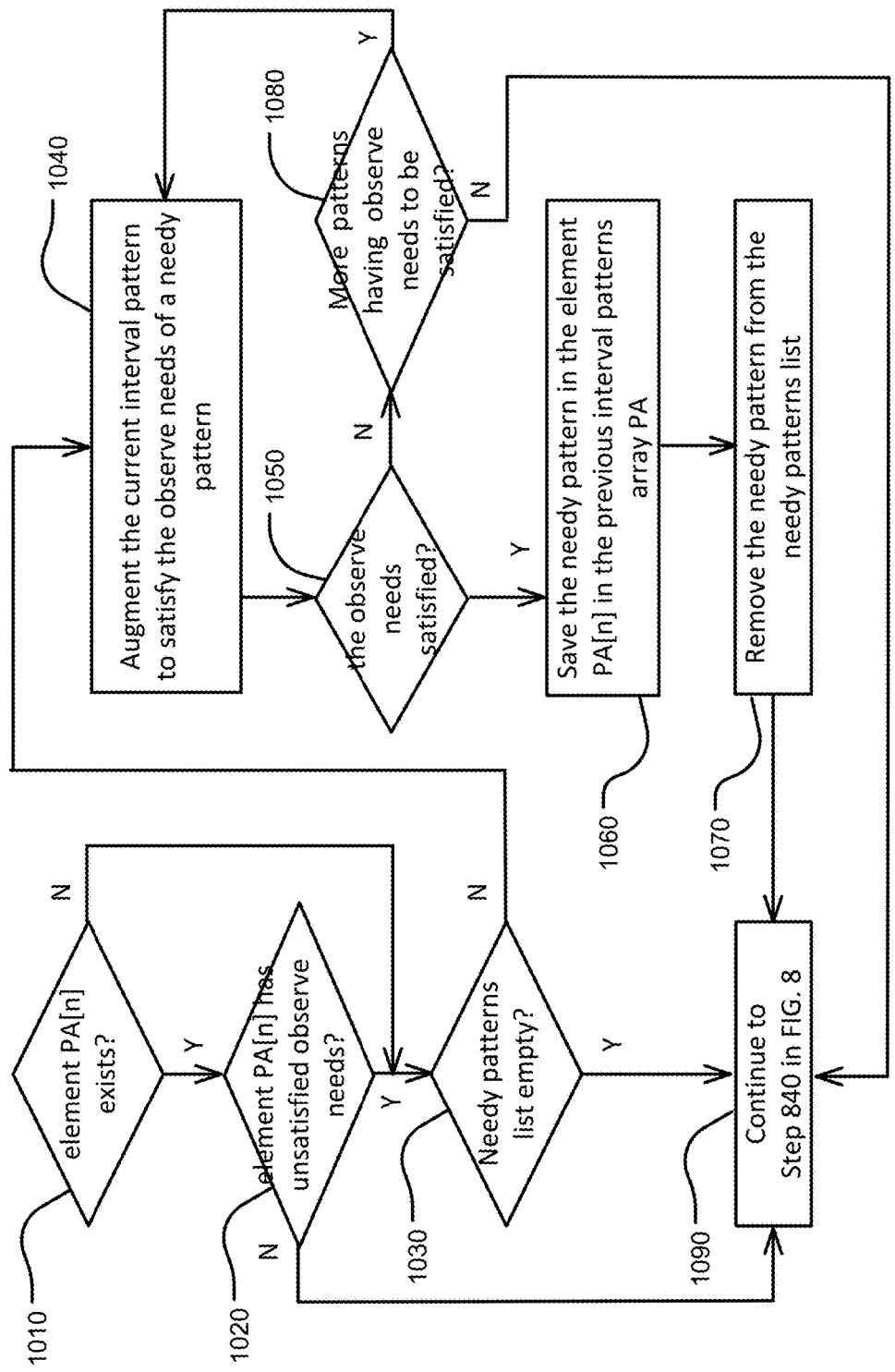

If the element PA[n] does not exist (Step 910->N), or if the element PA[n] does not have observe needs, or if the observe needs of the element PA[n] is satisfied, the flow then continues to Step 1010 in FIG. 10 (Step 960).

FIG. 10 further describes augmenting the current interval pattern, following FIG. 9. As shown in FIG. 10, it is determined if the element PA[n] exists in the previous interval patterns array PA (Step 1010). If the element PA[n] exists (Step 1010->Y), then it is determined if the element PA[n] has unsatisfied observe needs (Step 1020). If the element PA[n] does not exist (Step 1010->N) or if the element PA[n] has unsatisfied observe needs (Step 1020->Y), then it is determined if the needy patterns list is empty (Step 1030).

If the needy patterns list is not empty (Step 1030->N), then the needy patterns list is iterated to augment the current interval pattern to satisfy the observe needs of a needy pattern linked in the needy patterns list (Step 1040). In particular, the current interval pattern can be augmented by adding non-conflicting input values to the current interval pattern to satisfy the observe needs of the needy pattern linked in the needy patterns list. If the augmenting succeeds in satisfying the observe needs of the needy pattern (Step 1050->Y), then the needy pattern is saved in the element PA[n] in the previous interval patterns array PA (Step 1060); the needy pattern is removed from the needy patterns list (Step 1070); and the flow continues to Step 840 in FIG. 8 (Step 1090), without trying to augment more needy patterns in the needy patterns list.

As shown in the example of FIG. 5F, because a test pattern !Pat 33* in Interval 3 can satisfy unload control needs of #Pat 14* which is on the needy patterns list, therefore #Pat 14* is removed from the needy patterns list and test pattern #Pat 33* is linked after #Pat 14*. In this example, the previous interval patterns array PA includes the test patterns #Pat 20*, Pat 21, Pat 22 and Pat 24* generated in Interval 2, and the test pattern #Pat 14* removed from the needy patterns list is also saved in the previous interval patterns array PA.

If the augmenting does not succeed in satisfying the observe needs of the needy pattern (Step 1050->N), then it is determined if the needy patterns list has any patterns having observe needs to be satisfied (Step 1080). The needy patterns list does not have any patterns having observe needs to be satisfied, if the needy patterns list is empty, or if the needy patterns list is not empty but none of the remaining test patterns linked in the needy patterns list has observe needs that need to be satisfied. If the needy patterns list has any patterns having observe needs to be satisfied (Step 1080->Y), then the flow tries to augment the current interval pattern to satisfy the observe needs of another needy pattern linked in the needy patterns list (Step 1080->Y then Step 1040).

If the element PA[n] does not have unsatisfied observe needs (Step 1020->N), or if the needy patterns list is empty (Step 1030->Y), or if the needy patterns list does not have any patterns having observe needs to be satisfied (Step 1080->N), then the flow continues to Step 840 in FIG. 8 (Step 1090).

Figure 11:
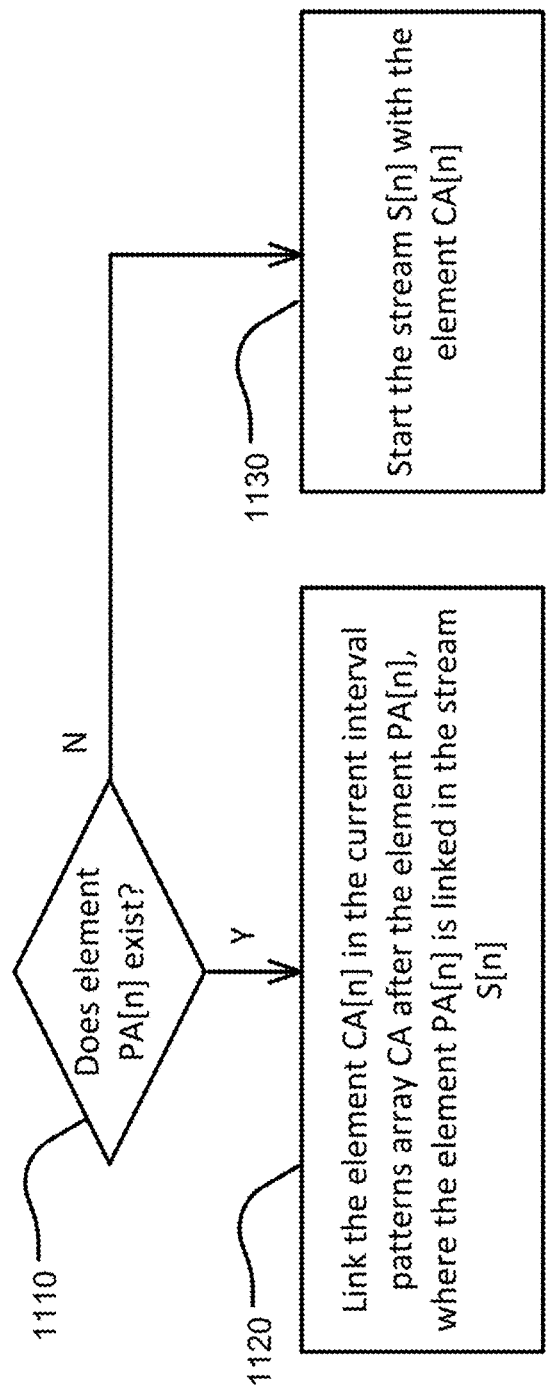

FIG. 11 illustrates an example for linking the element CA[n] to a stream S[n] in the P streams. At Step 1110, it is determined if the element PA[n] exists in the previous interval patterns array PA. If the element PA[n] exists (Step 1110->Y), then the element CA[n] in the current interval patterns array CA is linked after the element PA[n], where the element PA[n] is linked in the stream S[n] (Step 1120). If the element PA[n] does not exist (Step 1110->N), then the stream S[n] is started with the element CA[n] (Step 1130). In reference to the example of FIG. 5C, for n=1, stream S[1] starts with a test pattern Pat 00 in Interval 0, which is in the element PA[1] in the previous interval patterns array PA, and a test pattern Pat 10* in Interval 1, which is in the element CA[1] in the current interval patterns array CA, is linked after the element PA[1]. For n=4, the element PA[4] does not exist in Interval 0, then the stream S[4] is started with the element CA[4] where the test pattern Pat 13* in Interval 1 is saved.

Figure 12:
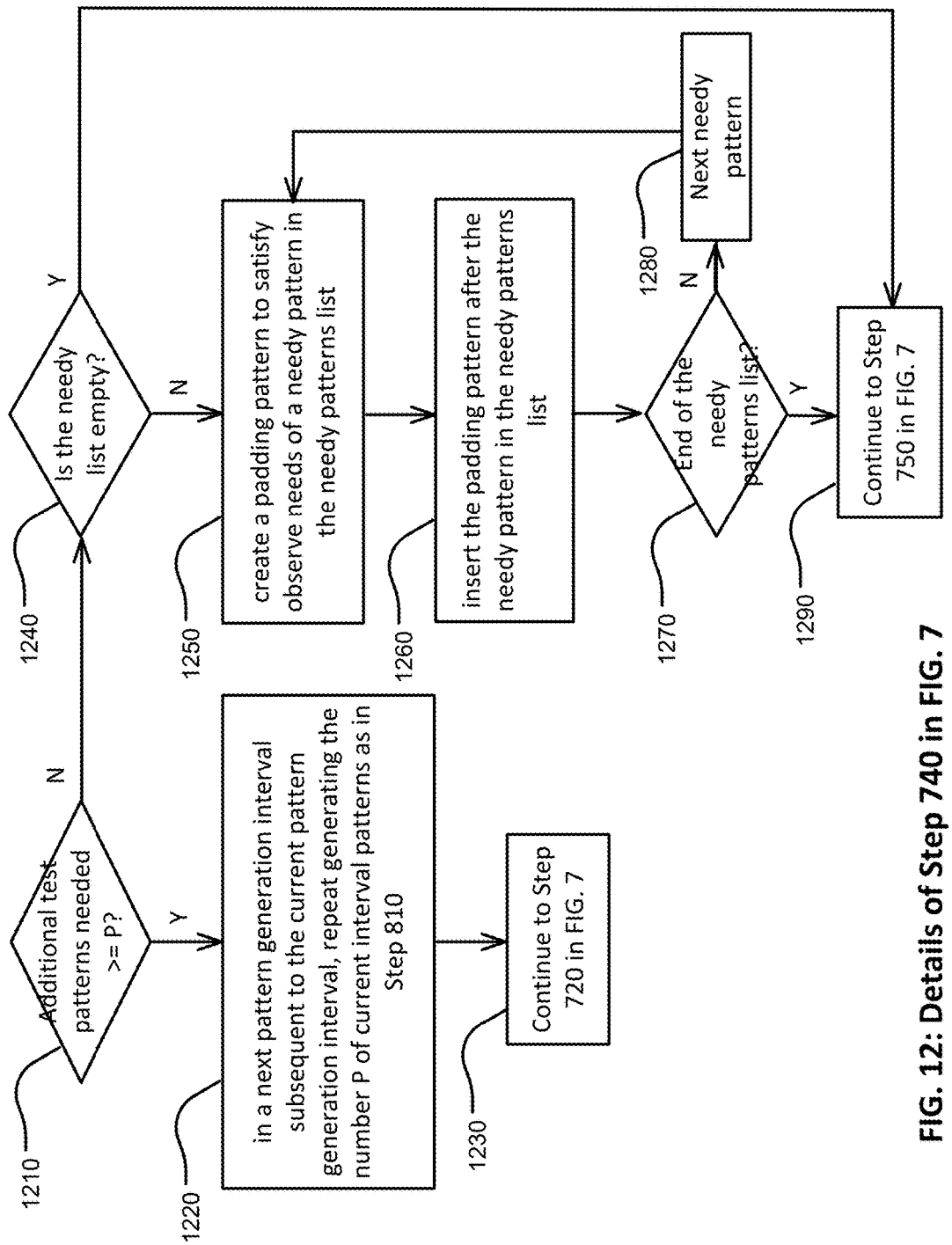

FIG. 12 illustrates an example for generating additional test patterns after the current pattern generation interval. At Step 1210, it is determined if a number of additional test patterns needed after the current pattern generation interval is equal to or greater than P. If yes (Step 1210->Y), then Step 710 is repeated to generate a P number of additional test patterns, in a next pattern generation interval subsequent to the current pattern generation interval (Step 1220), and the flow continues to Step 720 in FIG. 7 (Step 1230).

If a number of additional test patterns needed after the current pattern generation interval is less than P (Step 1210->N), and the needy list is not empty (Step 1240->N), then the needy patterns list is iterated, to create a padding pattern to satisfy observe needs of a needy pattern in the needy patterns list (Step 1250); and insert the padding pattern after the needy pattern in the needy patterns list (Step 1260). If the needy patterns list is empty (Step 1240->Y) or the end of the needy patterns list is reached (Step 1270->Y), then the flow continues to Step 750 in FIG. 7 (Step 1290), otherwise another padding pattern is created to satisfy observe needs of a next needy pattern in the needy patterns list (Steps 1280 then 1250).

Figure 13:
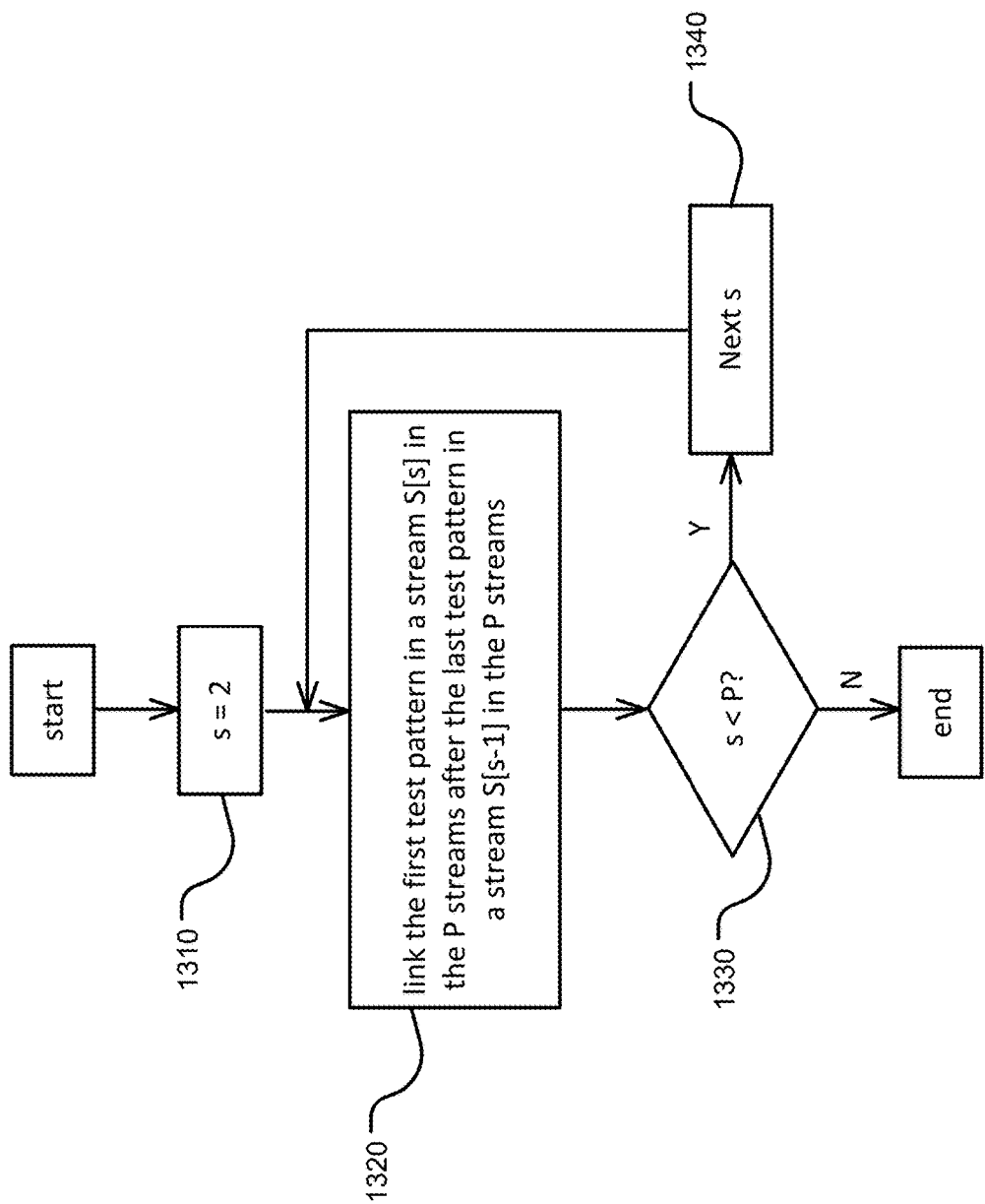

FIG. 13 illustrates an example for linking the P streams of test patterns into a single stream of test patterns in an example, where test patterns in each of the P streams of test patters are linked from a first test pattern to a last test pattern. Starting at s=2 (Step 1310), the first test pattern in a stream S[s] in the P streams is linked after the last test pattern in a stream S[s-1] in the P streams (Step 1320). Ifs is less than P (Step 1330->Y), then the flow continues to link the first test pattern in a stream S[s] in the P streams after the last test pattern in a stream S[s-1] in the P streams using a next s (Step 1340 then 1320). For example the next s can be s incremented by 1. Ifs is equal to or greater than P (Step 1330->N), then linking the P streams of test patterns into a single stream of test patterns is completed. In reference to the example of FIG. 5F, to link the P streams of test patterns into a single stream of test patterns, for s=2, the first test pattern in a stream S[2] (e.g. Pat 01*) is linked after the last test pattern in a stream S[1] (e.g. #Pat 30*).

Figure 14:
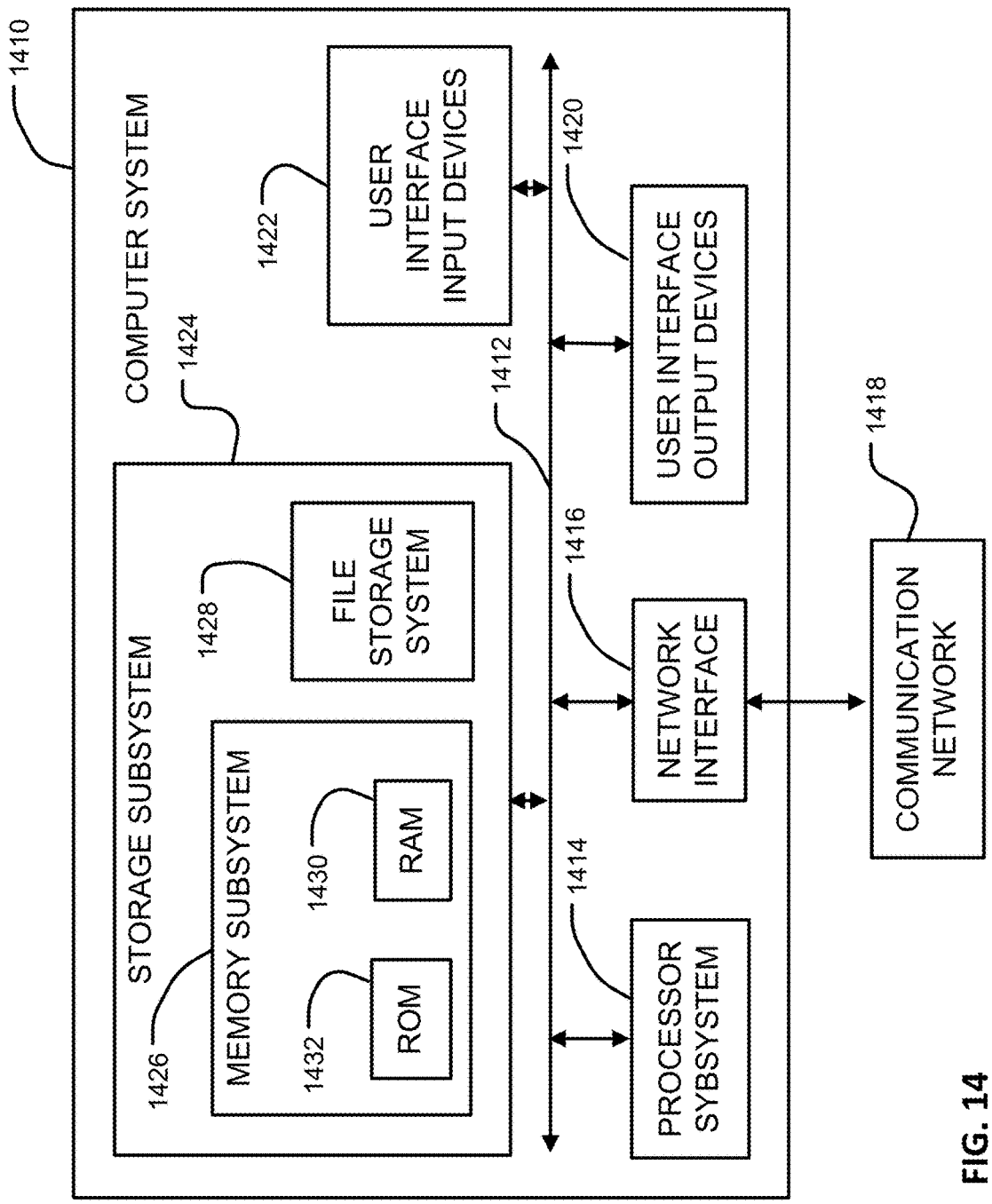
FIG. 14 is a simplified block diagram of a computer system that can be used to implement EDA software incorporating aspects of the present technology.

FIG. 14 is a simplified block diagram of a computer system 1410 that can be used to implement Electronic Design Automation (EDA) software incorporating aspects of the present technology. While the flow charts and other algorithms set forth herein describe series of steps, it will be appreciated that each step of the flow chart or algorithm (e.g. FIGS. 7-14) can be implemented by causing a computer system such as 1410 to operate in the specified manner.

Computer system 1410 typically includes a processor subsystem 1414 which communicates with a number of peripheral devices via bus subsystem 1412. Processor subsystem 1414 may contain one or a number of processors. The peripheral devices may include a storage subsystem 1424, comprising a memory subsystem 1426 and a file storage subsystem 1428, user interface input devices 1422, user interface output devices 1420, and a network interface subsystem 1416. The input and output devices allow user interaction with computer system 1410. Network interface subsystem 1416 provides an interface to outside networks, including an interface to communication network 1418, and is coupled via communication network 1418 to corresponding interface devices in other computer systems. Communication network 1418 may comprise many interconnected computer systems and communication links. These communication links may be wireline links, optical links, wireless links, or any other mechanisms for communication of information. While in one embodiment, communication network 1418 is the Internet, in other embodiments, communication network 1418 may be any suitable computer network.

The physical hardware component of network interfaces are sometimes referred to as network interface cards (NICs), although they need not be in the form of cards: for instance they could be in the form of integrated circuits (ICs) and connectors fitted directly onto a motherboard, or in the form of macrocells fabricated on a single integrated circuit chip with other components of the computer system.

User interface input devices 1422 may include a keyboard, pointing devices such as a mouse, trackball, touchpad, or graphics tablet, a scanner, a touch screen incorporated into the display, audio input devices such as voice recognition systems, microphones, and other types of input devices. In general, use of the term "input device" is intended to include all possible types of devices and ways to input information into computer system 1410 or onto computer network 1418.

User interface output devices 1420 may include a display subsystem, a printer, a fax machine, or non-visual displays such as audio output devices. The display subsystem may include a cathode ray tube (CRT), a flat-panel device such as a liquid crystal display (LCD), a projection device, or some other mechanism for creating a visible image. The display subsystem may also provide non-visual display such as via audio output devices. In general, use of the term "output device" is intended to include all possible types of devices and ways to output information from computer system 1410 to the user or to another machine or computer system.

Storage subsystem 1424 stores the basic programming and data constructs that provide the functionality of certain embodiments of the present technology. For example, the various modules implementing the functionality of certain embodiments of the present technology may be stored in storage subsystem 1424. These software modules are generally executed by processor subsystem 1414.

Memory subsystem 1426 typically includes a number of memories including a main random access memory (RAM) 1430 for storage of computer instructions and data during program execution and a read only memory (ROM) 1432 in which fixed computer instructions are stored. File storage subsystem 1428 provides persistent storage for program and data files, and may include a hard disk drive, a floppy disk drive along with associated removable media, a CD ROM drive, an optical drive, or removable media cartridges. The databases and modules implementing the functionality of certain embodiments of the present technology may have been provided on a computer readable medium such as one or more CD-ROMs, and may be stored by file storage subsystem 1428. The host memory 1426 contains, among other things, computer instructions which, when executed by the processor subsystem 1414, cause the computer system to operate or perform functions as described herein. As used herein, processes and software that are said to run in or on "the host" or "the computer", execute on the processor subsystem 1414 in response to computer instructions and data in the host memory subsystem 1426 including any other local or remote storage for such computer instructions and data.

Bus subsystem 1412 provides a mechanism for letting the various components and subsystems of computer system 1410 communicate with each other as intended. Although bus subsystem 1412 is shown schematically as a single bus, alternative embodiments of the bus subsystem may use multiple busses.

Computer system 1410 itself can be of varying types including a personal computer, a portable computer, a workstation, a computer terminal, a network computer, a television, a mainframe, a parallel processing system, a network of more than one computer, or any other data processing system or user device. Due to the ever-changing nature of computers and networks, the description of computer system 1410 depicted in FIG. 14 is intended only as a specific example for purposes of illustrating the preferred embodiments of the present technology. Many other configurations of computer system 1410 are possible having more or less components than the computer system depicted in FIG. 14.

The embodiments were chosen and described in order to best explain the principles of the present technology and its practical application, thereby enabling others skilled in the art to understand the present technology for various embodiments and with various modifications as are suited to the particular use contemplated. It is intended that the scope of the present technology be defined by the following claims.

We claim as follows:

1. A method for generating scan-based test patterns for an integrated circuit design, comprising:
    initializing in a computer system a specification of an integrated circuit design which includes a circuit under test, a plurality of scan chains, a load decompressor, and an unload compressor;
    the computer system generating a number P>1 of current interval patterns for the integrated circuit design in a current pattern generation interval, including augmenting the current interval patterns to satisfy observe needs of a previous interval pattern generated in a previous pattern generation interval as maintained in the computer system, storing observe needs of the current interval patterns in association with the current interval patterns, and adding current interval patterns in the number P of current interval patterns into respective streams in P streams of test patterns;
    simulating the current interval patterns to identify observable scan cells in the integrated circuit design;
    linking combining the P streams of test patterns into a single stream of test patterns for the integrated circuit design; and
    storing the single stream of test patterns in a computer readable medium.

2. The method of claim 1, comprising:
    in the computer system, maintaining a previous interval patterns array PA of P elements for saving test patterns generated in the previous pattern generation interval, a current interval patterns array CA of P elements for saving test patterns generated in the current pattern generation interval, and a needy patterns list for adding test patterns having unsatisfied observe needs; and
    in the current pattern generation interval, repeating for n going from 1 to P:
        generating a current interval pattern for the integrated circuit design, including determining the observe needs of the current interval pattern;
        augmenting the current interval pattern to satisfy observe needs of a previous interval pattern saved in an element PA[n] in the previous interval patterns array PA or added in the needy patterns list;
        storing the observe needs determined by said generating the current interval pattern in association with the current interval pattern;
        saving the current interval pattern in an element CA[n] in the current interval patterns array CA; and
        adding the element CA[n] into a stream S[n] in the P streams.

3. The method of claim 2, wherein the observe needs determined by said generating the current interval pattern identify scan cells required to be observed in the integrated circuit design.

4. The method of claim 2, said augmenting comprising:
    if the element PA[n] exists and has unsatisfied observe needs, then
        augmenting the current interval pattern to satisfy the observe needs of the element PA[n]; and
        if the observe needs of the element PA[n] is not satisfied, then adding the element PA[n] into the needy patterns list.

5. The method of claim 4, further comprising:
    if the element PA[n] does not exist, or the element PA[n] exists but has unsatisfied observe needs, then if the needy patterns list is not empty, then
    repeating for each pattern in the needy patterns list, including:
        augmenting the current interval pattern to satisfy the observe needs of a needy pattern added in the needy patterns list; and
        if the observe needs of the needy pattern is satisfied, then:
            saving the needy pattern in the element PA[n] in the previous interval patterns array PA;
            removing the needy pattern from the needy patterns list; and
            exiting said repeating;
        else continue said repeating until the needy patterns list does not have any patterns having observe needs to be satisfied.

6. The method of claim 2, said adding the element CA[n] into the stream S[n] comprising:
    if the element PA[n] exists in the previous interval patterns array PA, then
        adding the element CA[n] in the current interval patterns array CA into the stream S[n] after the element PA[n], where the element PA[n] is added in the stream S[n]; and
    else
        starting the stream S[n] with the element CA[n].

7. The method of claim 2, comprising:
    in the computer system, before said generating the number P>1 of current interval patterns,
    initializing the previous interval patterns array to have zero element;
    initializing the current interval patterns array to have zero element; and
    initializing the needy patterns list to be an empty list.

8. The method of claim 2, comprising:
    in the computer system, after said simulating and before said combining the P streams, copying the current interval patterns saved in elements in the current interval patterns array to corresponding elements in the previous interval patterns array.

9. The method of claim 8, comprising:
    in the computer system, after said copying and before said combining the P streams, if a number of additional test patterns needed after the current pattern generation interval is equal to or greater than P, then
        in a next pattern generation interval subsequent to the current pattern generation interval, repeating said generating the number P>1 of current interval patterns.

10. The method of claim 8, comprising:
    in the computer system, after said copying and before said combining the P streams, if a number of additional test patterns needed after the current pattern generation interval is less than P, and the needy patterns list is not empty, then repeating for each pattern in the needy patterns list, including:
creating a padding pattern to satisfy observe needs of a needy pattern in the needy patterns list; and
inserting the padding pattern after the needy pattern in the needy patterns list.

11. The method of claim 1, wherein test patterns in each of the P streams of test patterns are added from a first test pattern to a last test pattern, said combining the P streams comprising:
in the computer system, repeating for s going from 2 to P, adding the first test pattern in a stream S[s] in the P streams into the single stream of test patterns after the last test pattern in a stream S[s−1] in the P streams.

12. The method of claim 1, comprising:
after said storing the single stream of test patterns, delivering the single stream of test patterns to chip testing equipment; and
testing an integrated circuit having the integrated circuit design using the single stream of test patterns on the chip testing equipment.

13. A computer system for generating scan-based test patterns for an integrated circuit design, comprising:
a processor;
a storage subsystem coupled to the processor;
a specification in the storage subsystem of an integrated circuit design which includes a circuit under test, a plurality of scan chains, a load decompressor, and an unload compressor; and
computer instructions in the storage subsystem which when executed by the processor perform the steps of:
generating a number P>1 of current interval patterns for the integrated circuit design in a current pattern generation interval, including augmenting the current interval patterns to satisfy observe needs of a previous interval pattern generated in a previous pattern generation interval as maintained in the computer system, storing observe needs of the current interval patterns in association with the current interval patterns, and adding current interval patterns in the number P of current interval patterns into respective streams in P streams of test patterns;
simulating the current interval patterns to identify observable scan cells in the integrated circuit design;
combining the P streams of test patterns into a single stream of test patterns for the integrated circuit design; and
storing the single stream of test patterns in a computer readable medium.

14. The computer system of claim 13, comprising:
maintaining a previous interval patterns array PA of P elements for saving test patterns generated in the previous pattern generation interval, a current interval patterns array CA of P elements for saving test patterns generated in the current pattern generation interval, and a needy patterns list for adding test patterns having unsatisfied observe needs; and
in the current pattern generation interval, repeating for n going from 1 to P:
generating a current interval pattern for the integrated circuit design, including determining the observe needs of the current interval pattern;
augmenting the current interval pattern to satisfy observe needs of a previous interval pattern saved in an element PA[n] in the previous interval patterns array PA or added in the needy patterns list;
storing the observe needs determined by said generating the current interval pattern in association with the current interval pattern;
saving the current interval pattern in an element CA[n] in the current interval patterns array CA; and
adding the element CA[n] into a stream S[n] in the P streams.

15. The computer system of claim 14, wherein the observe needs determined by said generating the current interval pattern identify scan cells required to be observed in the integrated circuit design.

16. The computer system of claim 14, said augmenting comprising:
if the element PA[n] exists and has unsatisfied observe needs, then
augmenting the current interval pattern to satisfy the observe needs of the element PA[n]; and
if the observe needs of the element PA[n] is not satisfied, then adding the element PA[n] into the needy patterns list.

17. The computer system of claim 16, further comprising:
if the element PA[n] does not exist, or the element PA[n] exists but has unsatisfied observe needs, then if the needy patterns list is not empty, then
repeating for each pattern in the needy patterns list, including:
augmenting the current interval pattern to satisfy the observe needs of a needy pattern added in the needy patterns list; and
if the observe needs of the needy pattern is satisfied, then:
saving the needy pattern in the element PA[n] in the previous interval patterns array PA;
removing the needy pattern from the needy patterns list; and
exiting said repeating;
else continue said repeating until the needy patterns list does not have any patterns having observe needs to be satisfied.

18. The computer system of claim 14, said adding the element CA[n] into the stream S[n] comprising:
if the element PA[n] exists in the previous interval patterns array PA, then
adding the element CA[n] in the current interval patterns array CA into the stream S[n] after the element PA[n], where the element PA[n] is added in the stream S[n]; and
else
starting the stream S[n] with the element CA[n].

19. The computer system of claim 14, comprising:
before said generating the number P>1 of current interval patterns,
initializing the previous interval patterns array to have zero element;
initializing the current interval patterns array to have zero element; and
initializing the needy patterns list to be an empty list.

20. The computer system of claim 14, comprising:
after said simulating and before said combining the P streams, copying the current interval patterns saved in elements in the current interval patterns array to corresponding elements in the previous interval patterns array.

21. The computer system of claim 20, comprising:
after said copying and before said combining the P streams, if a number of additional test patterns needed after the current pattern generation interval is equal to or greater than P, then
in a next pattern generation interval subsequent to the current pattern generation interval, repeating said generating the number P>1 of current interval patterns.

22. The computer system of claim 20, comprising:
after said copying and before said combining the P streams, if a number of additional test patterns needed after the current pattern generation interval is less than P, and the needy patterns list is not empty, then repeating for each pattern in the needy patterns list, including:
creating a padding pattern to satisfy observe needs of a needy pattern in the needy patterns list; and
inserting the padding pattern after the needy pattern in the needy patterns list.

23. The computer system of claim 13, wherein test patterns in each of the P streams of test patterns are added from a first test pattern to a last test pattern, said combining the P streams comprising:
repeating for s going from 2 to P,
adding the first test pattern in a stream S[s] in the P streams into the single stream of test patterns after the last test pattern in a stream S[s−1] in the P streams.

24. The computer system of claim 13, comprising:
after said storing the single stream of test patterns, delivering the single stream of test patterns to chip testing equipment; and
testing an integrated circuit having the integrated circuit design using the single stream of test patterns on the chip testing equipment.

25. A tangible non-transitory computer readable medium storing computer readable instructions executable by a computer system, including:
computer instructions executable by the computer system to generate scan-based test patterns for an integrated circuit design which includes a circuit under test, a plurality of scan chains, a load decompressor, and an unload compressor, the computer instructions which when executed by a processor in the computer system perform the steps of:
generating a number P>1 of current interval patterns for the integrated circuit design in a current pattern generation interval, including augmenting the current interval patterns to satisfy observe needs of a previous interval pattern generated in a previous pattern generation interval as maintained in the computer system, storing observe needs of the current interval patterns in association with the current interval patterns, and adding current interval patterns in the number P of current interval patterns into respective streams in P streams of test patterns;
simulating the current interval patterns to identify observable scan cells in the integrated circuit design;
combining the P streams of test patterns into a single stream of test patterns for the integrated circuit design; and
storing the single stream of test patterns in a computer readable medium.

26. A computer system for generating scan-based test patterns for an integrated circuit design, comprising:
means for generating a number P>1 of current interval patterns for the integrated circuit design in a current pattern generation interval, including augmenting the current interval patterns to satisfy observe needs of a previous interval pattern generated in a previous pattern generation interval, storing observe needs of the current interval patterns in association with the current interval patterns, and adding current interval patterns in the number P of current interval patterns to respective streams in P streams of test patterns;
means for simulating the current interval patterns to identify observable scan cells in the integrated circuit design;
means for combining the P streams of test patterns into a single stream of test patterns; and
means for storing the single stream of test patterns in a computer readable medium.

27. A method for testing an integrated circuit device having an integrated circuit design, comprising:
in a computer system, generating a number P>1 of current interval patterns for the integrated circuit design in a current pattern generation interval, including augmenting the current interval patterns to satisfy observe needs of a previous interval pattern generated in a previous pattern generation interval, storing observe needs of the current interval patterns in association with the current interval patterns, and adding current interval patterns in the number P of current interval patterns into respective streams in P streams of test patterns;
simulating the current interval patterns to identify observable scan cells in the integrated circuit design;
combining the P streams of test patterns into a single stream of test patterns;
delivering to chip testing equipment test vectors in dependence upon the single stream of test patterns; and
the chip testing equipment testing the integrated circuit device using the test vectors.

* * * * *